United States Patent [19]

Dennison

[11] Patent Number: 5,292,677
[45] Date of Patent: Mar. 8, 1994

[54] REDUCED MASK CMOS PROCESS FOR FABRICATING STACKED CAPACITOR MULTI-MEGABIT DYNAMIC RANDOM ACCESS MEMORIES UTILIZING SINGLE ETCH STOP LAYER FOR CONTACTS

[75] Inventor: Charles H. Dennison, Boise, Id.
[73] Assignee: Micron Technology, Inc., Boise, Id.
[21] Appl. No.: 947,523
[22] Filed: Sep. 18, 1992
[51] Int. Cl.$^5$ ............................................. H01L 21/70
[52] U.S. Cl. ....................................... 437/52; 437/47; 437/48; 437/60; 437/919
[58] Field of Search ................. 437/47, 48, 52, 60, 437/919, 235, 238; 257/308, 306

[56] References Cited

U.S. PATENT DOCUMENTS 5,087,591  2/1992  Teng ................................ 437/238
5,118,382  6/1992  Cronin et al. ..................... 437/238

OTHER PUBLICATIONS

Kawamoto et al., "A 1.28μm$^2$ Bit-Line Shielded Memory Cell Technology for 64Mb DRAMS", Symposium on VLSI Technology, 1990, pp. 13-14.
Itoh et al., "Two Step Deposited Rugged Surface (TDRS) Storagenode and Self Aligned Bitline-Contact Penetrating Cellplate (SABPEC) for 64 MbDRAM STC Cell" IEEE Symposium on VLSI Technology, 1991, pp. 9-10.
Shibata et al., "A Novel Zero-Overlap/Enclosure Metal Interconnection Technology for High Density Logic VLSI's", IEEE VMIC Conference, 1990, pp. 15-21.

*Primary Examiner*—Tom Thomas
*Attorney, Agent, or Firm*—Dorr, Carson, Sloan & Peterson

[57] ABSTRACT

An etch stop layer is deposited on a DRAM wafer after formation of the PMOS and NMOS transistors and A.A.'s. After deposition of oxide 1, a first mask and etch process is used to form the capacitor container and remove the oxide 1 and etch stop at the future poly 1 and cell poly contacts. After deposition of the capacitor, a second mask and etch removes the capacitor layers at the future poly 1 contact. After deposition of oxide 2 and a poly etch stop layer, a third mask and etch process forms the bit line contact region through the cell poly, and the poly 1 and cell poly contact region. The etch is made through the cell poly at the bit line contact and a thin oxide is deposited and etched to form cell poly spacers that don't close off the active area. An oxide etch goes to the etch stop layer at the bit contact region, to the poly 1 at the future poly 1 contact, and to the cell poly at the future cell poly contact. After etch of the etch stop at the future bit line contact, the contacts are formed.

18 Claims, 15 Drawing Sheets

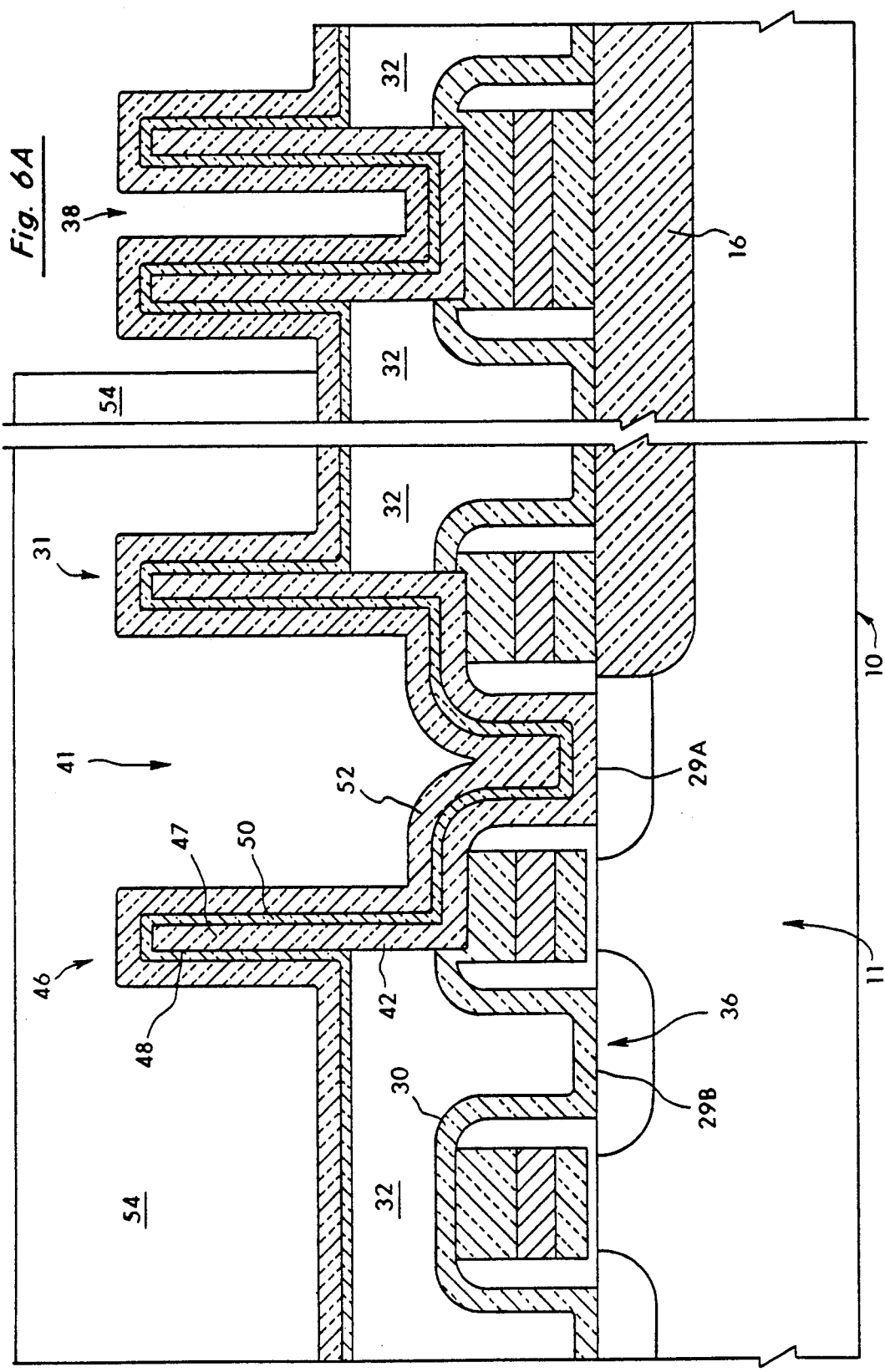

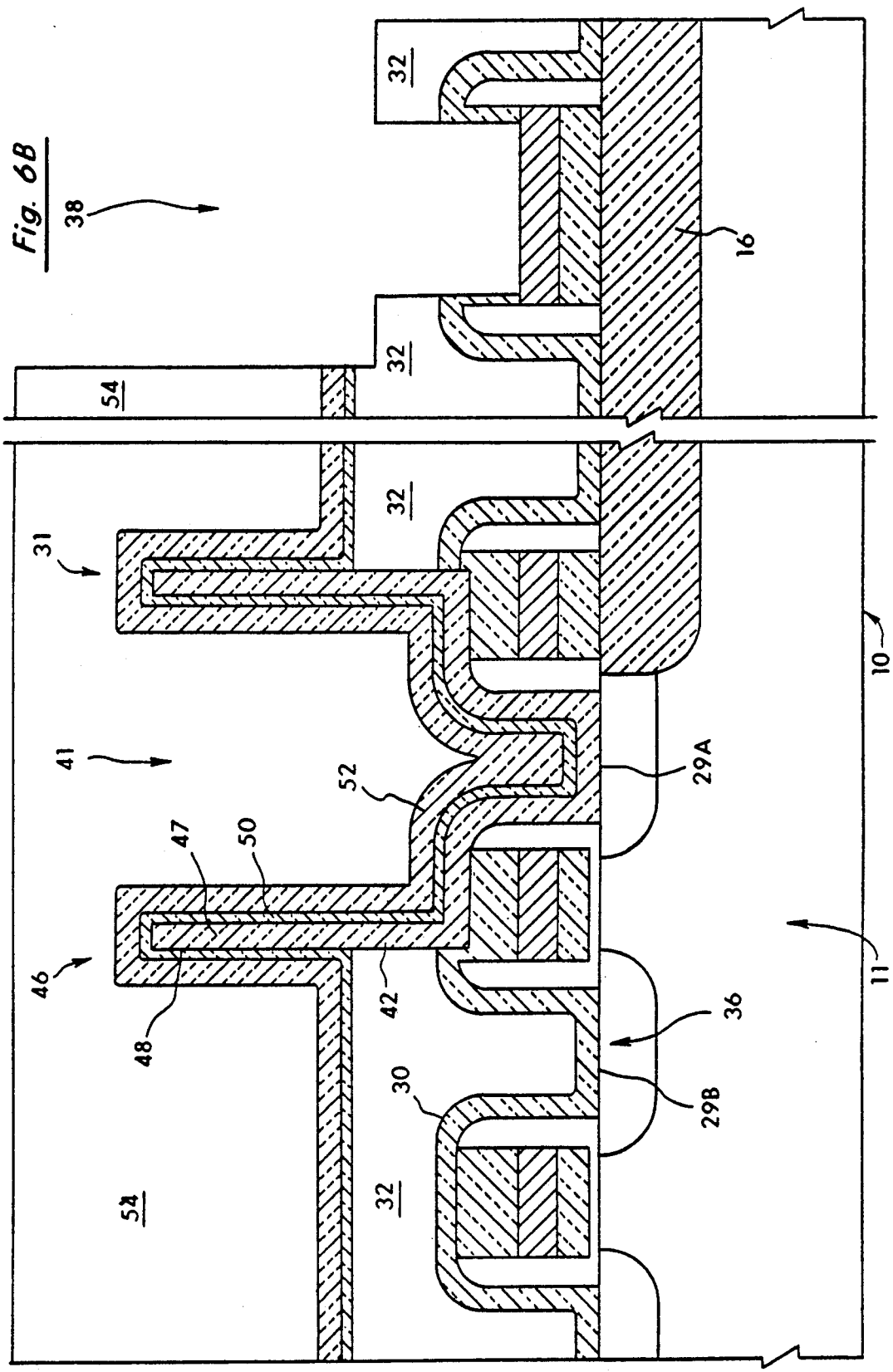

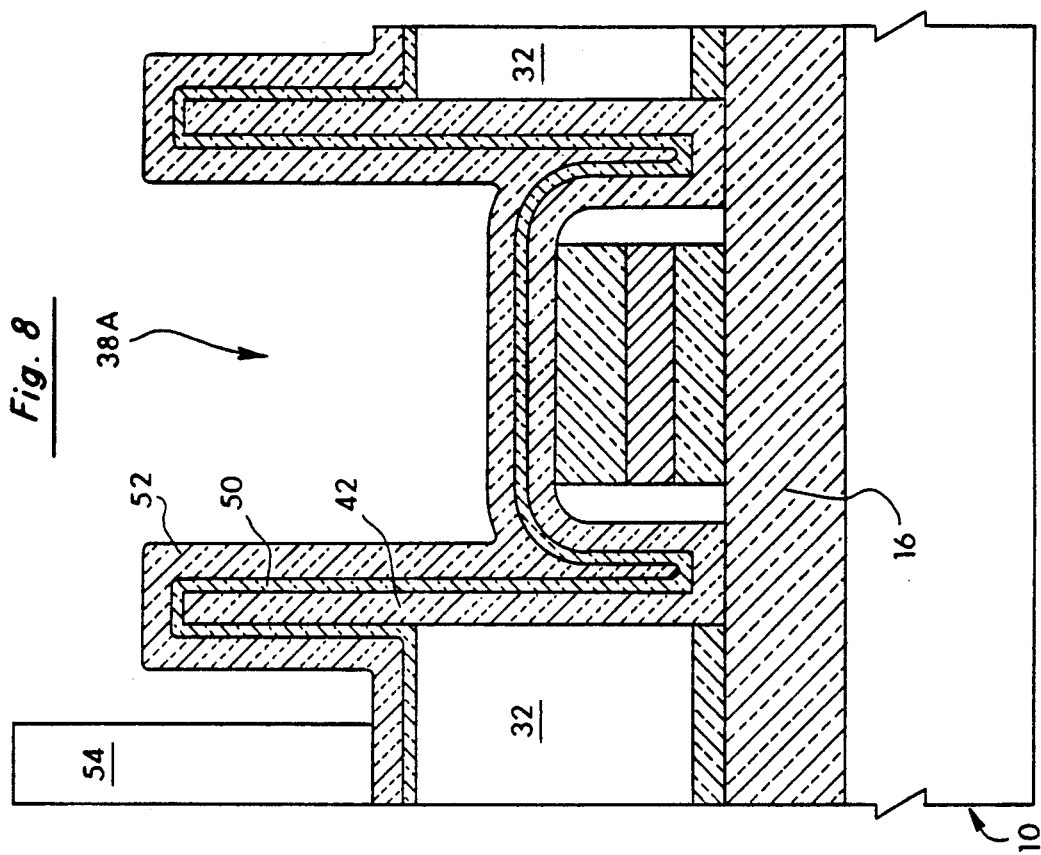
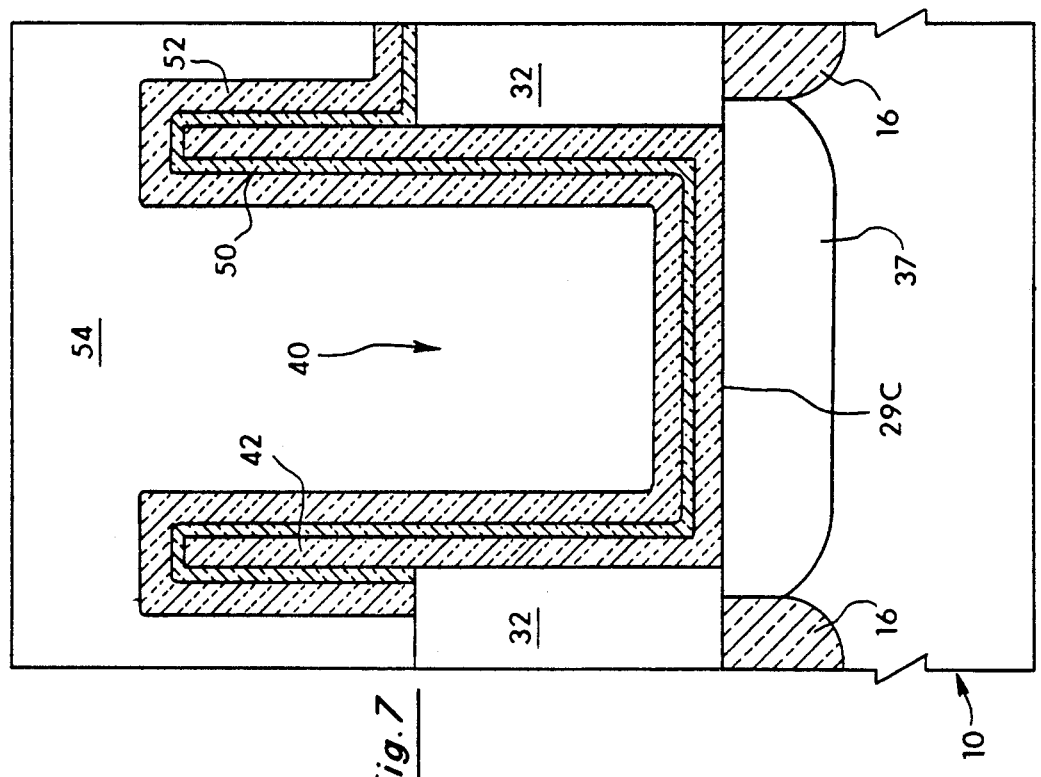

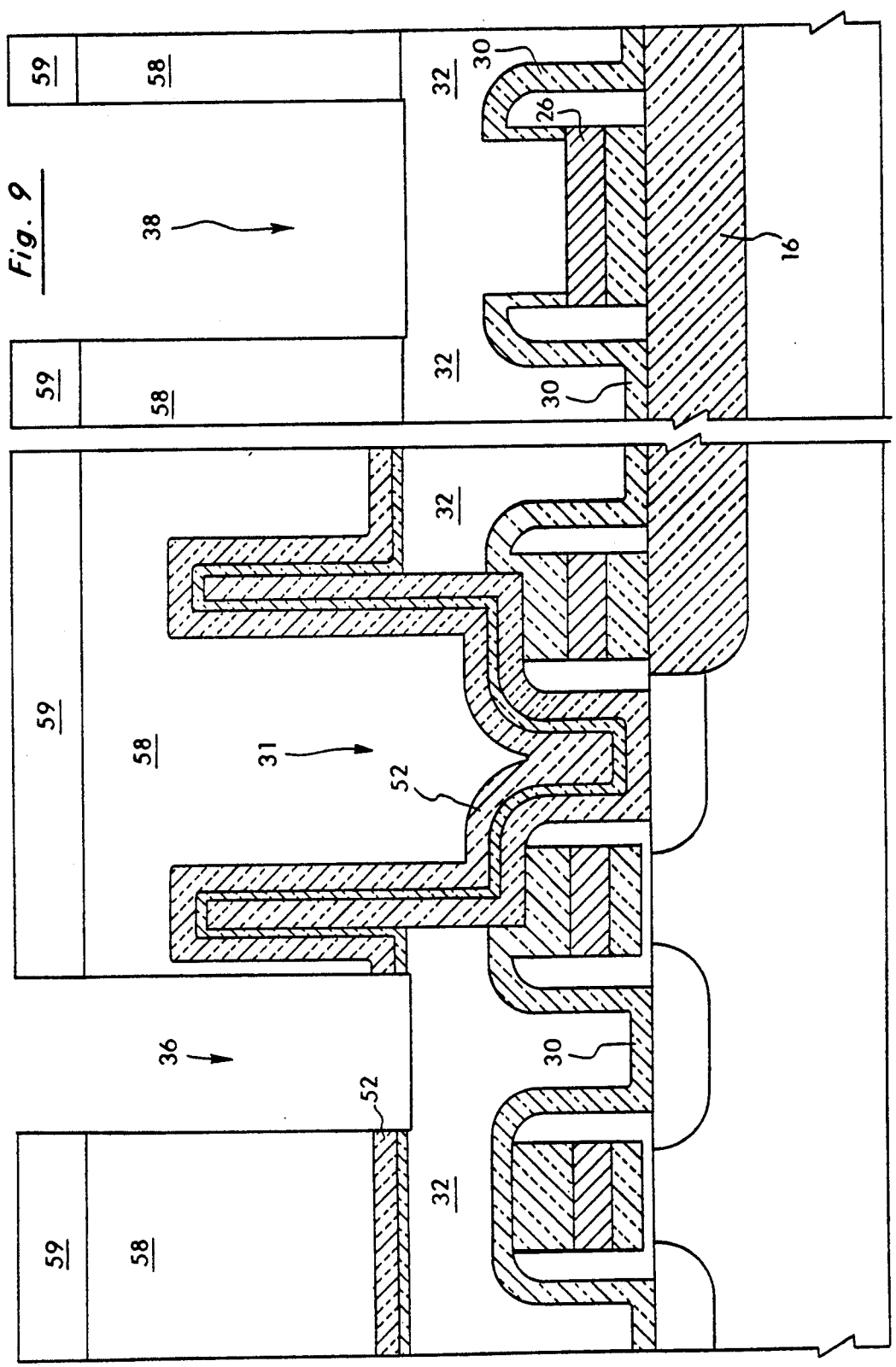

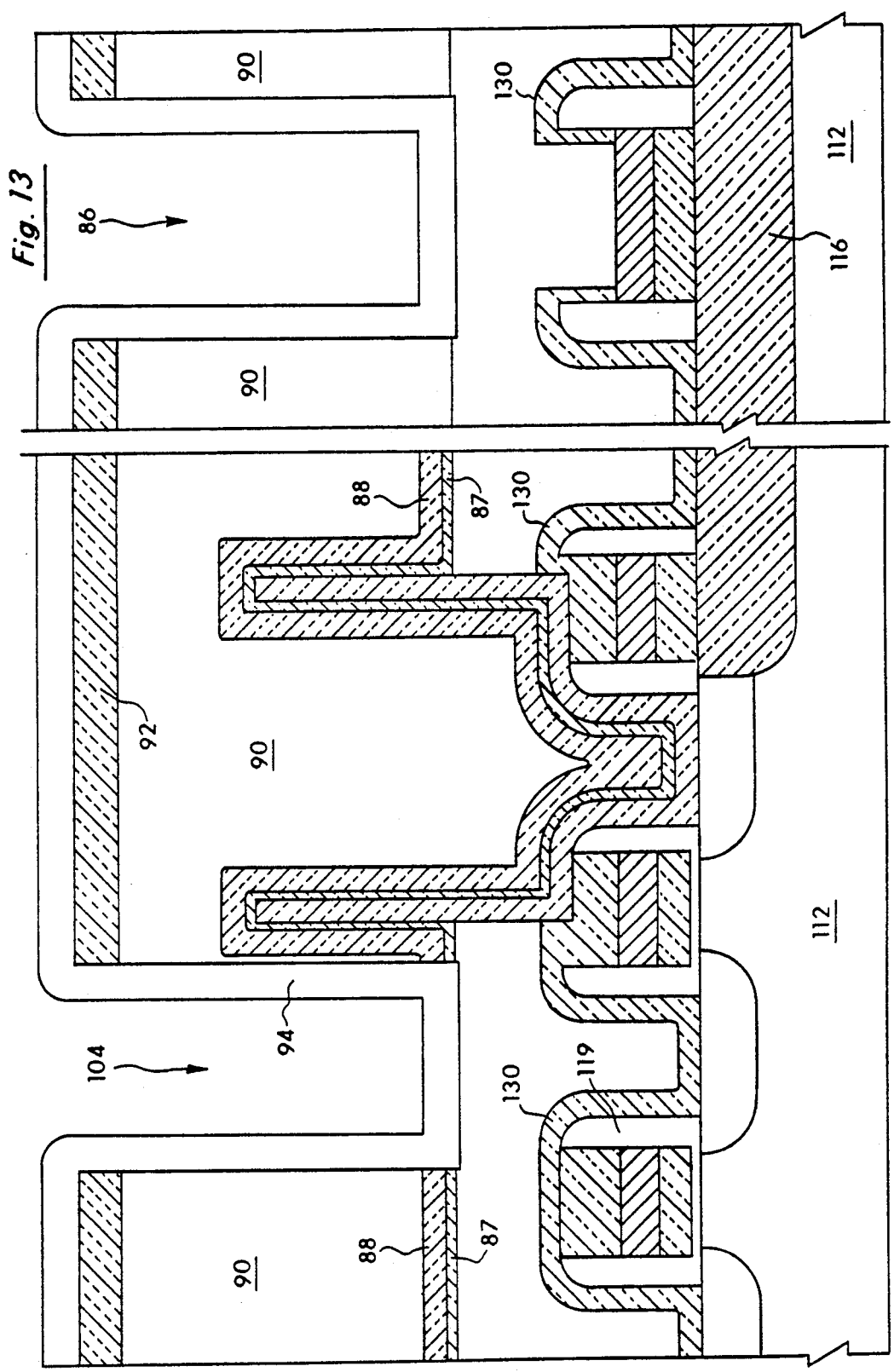

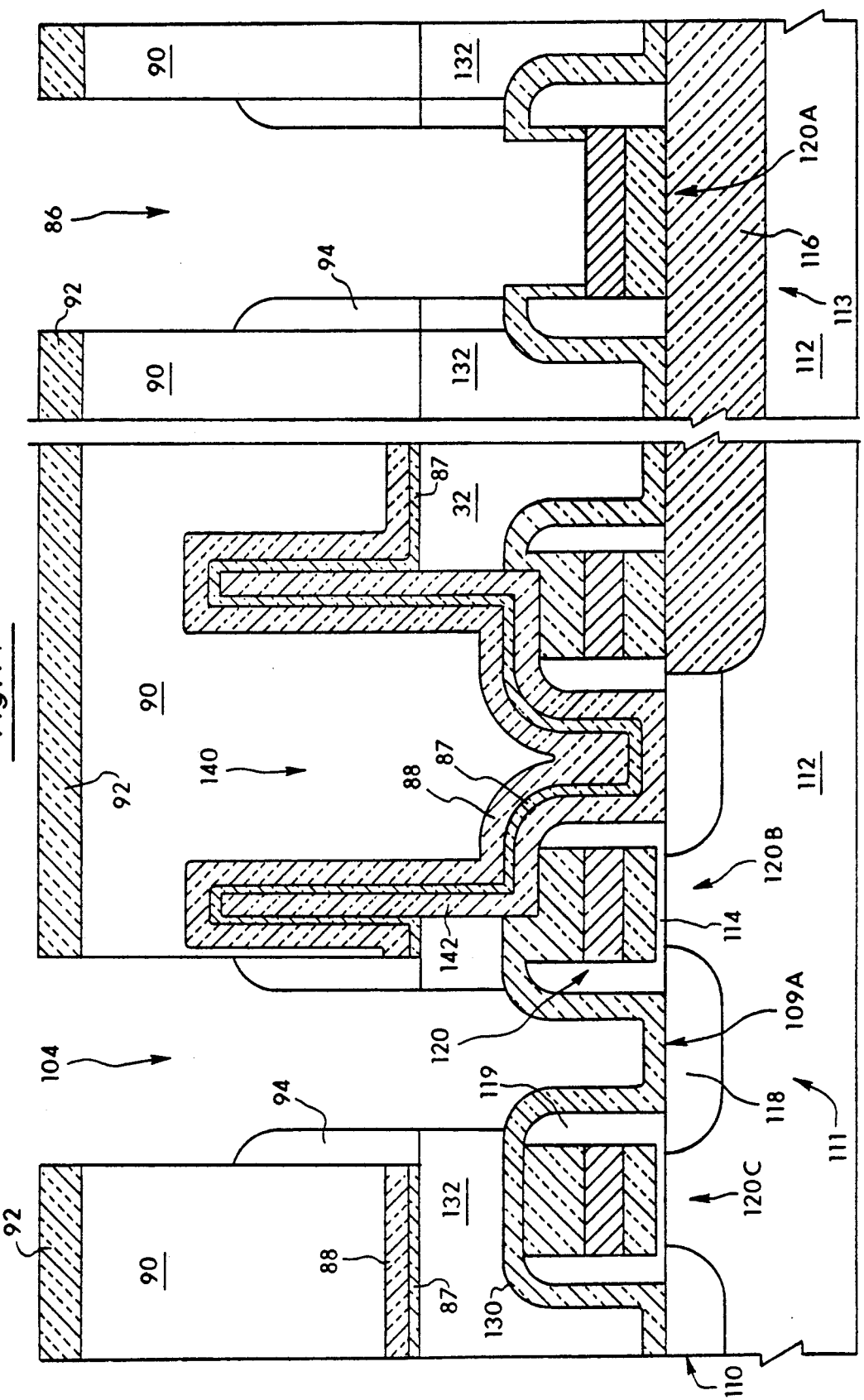

REDUCED MASK CMOS PROCESS FOR FABRICATING STACKED CAPACITOR MULTI-MEGABIT DYNAMIC RANDOM ACCESS MEMORIES UTILIZING SINGLE ETCH STOP LAYER FOR CONTACTS

BACKGROUND OF THE INVENTION

1. Field of the Invention

The invention in general relates to the structure and fabrication of integrated circuits and more particularly to a process for fabrication of a stacked capacitor DRAM.

2. Statement of the Problem

As is well-known, integrated circuits, sometimes called semiconductor devices, are generally mass produced by fabricating hundreds of identical circuit patterns on a single semiconducting wafer, which wafer is subsequently sawed into hundreds of identical dies or chips. While integrated circuits are commonly referred to as "semiconductor devices" they are in fact fabricated from various materials which are either electrically conductive, electrically nonconductive, or electrically semiconductive. Silicon, the most commonly used semiconductor material, can be used in either the single crystal or polycrystalline form. In the integrated circuit fabrication art, o polycrystalline silicon is usually called "polysilicon" or simply "poly", and shall be referred to as such herein. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as P-type silicon. If the doping is with an element such as phosphorus which has one more valence electron than silicon, additional electrons become the dominant charge carriers and the doped silicon is referred to as N-type silicon.

CMOS (Complimentary Metal Oxide Semiconductor) technology is currently the most commonly used integrated circuit technology, and thus the present invention will be described in terms of silicon-based CMOS technology, although it is evident that it may find uses in other integrated circuit technologies. The term CMOS is now loosely applied to mean any integrated circuit in which both N-channel and P-channel MOSFETs (Metal-Oxide-Semiconductor Field Effect Transistors) are used in a complimentary fashion. It should be noted here that because the dominant carrier in a MOSFET occurs in an inversion layer, the channel of an N-channel MOSFET is actually doped P-type and the channel of a P-channel MOSFET is actually doped N-type. CMOS integrated circuit o fabrication may begin with a lightly-doped P-type silicon substrate, a lightly-doped N-type silicon substrate, or lightly-doped epitaxial silicon (deposited crystalline silicon) on a heavily doped substrate. For the sake of simplicity, the invention will be described using lightly-doped P-type silicon as the starting material, although it may be implemented with other materials as the starting point. If other materials are used as the starting point, there may be differences in materials and structure as is well-known in the art, e.g. with N-type silicon as the starting point dopant types may be reversed, or P-type wells may be introduced.

One well-know integrated fabrication process is the photo-mask and etch process which comprises: creating a photolithographic mask containing the pattern of the parts to be fabricated, coating the integrated circuit wafer with a light-sensitive material called photoresist or resist, exposing the resist-coated wafer to ultraviolet light through the mask to soften or harden parts of the resist depending on whether positive or negative resist is used, removing the softened parts of the resist, etching the wafer to remove the part unprotected by the resist, and stripping the remaining resist. Etching which forms part of the photo-mask and etch process is itself a highly developed process which is used in many instances besides in conjunction with the photo-mask. It is well-know that etches can be made that etch one material relatively rapidly while etching another material hardly at all. When an etch does not etch a material it is said to be "selective" to that material. That is, it selectively leaves that material while etching away other materials.

Most current-generation DRAM (Dynamic Random Access Memory) manufactures utilize CMOS technology. DRAM circuits comprise arrays of memory cells, each cell comprising two main components: a field effect transistor and a capacitor. In the most common circuit designs, one side of the transistor is connected to one side of the capacitor, the other side of the transistor and the transistor gate are connected to external connection lines called the bit line and word line, respectively, and the other side of the capacitor is connected to a reference voltage that is typically ½ the internal circuit voltage. Thus the fabrication of the Dram cell essentially comprises the fabrication of a transistor, a capacitor, and three contacts to external circuits.

The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. The requirements of holding a charge large enough to be sensed for a long enough time for practical memory applications result in the capacitor being the largest of the circuit parts. Thus, the drive to produce smaller DRAM circuits has give risen to much capacitor development, which can be classified into three basic capacitor types: planar capacitors, trench capacitors and stacked capacitors. For reasons of available capacitance, reliability, and ease of fabrication, most manufacturers of DRAMS of 4-Megabit and larger capacity utilize stacked capacitor designs in which the capacitor covers nearly the entire area of a cell and in which vertical portions of the capacitor contribute significantly to the total charge storing capacity. In such designs the side of the capacitor connected to the transistor is generally called the "storage node" or "storage poly" since the material out of which it is formed is doped polysilicon, while the polysilicon layer defining the side of the capacitor connected to the reference voltage mentioned above is called the "cell poly".

An area in a integrated circuit to which electrical connection is to be made is generally called an active area (A.A.). As capacitors have covered ever larger areas of individual cells and as the size of the cells has shrunk, the size of active areas as well as the corridors available for contacts to reach the A.A.'s has also shrunk. With these smaller spaces, the chances for leakage between the contacts and transistor and capacitor components and the chances of high resistance or open circuit contacts has increased. Thus a DRAM structure and fabrication process that provides more effective isolation of the contacts from the other parts of the DRAM circuit, optimizes the area in which contact may be made, and at the same time permits smaller contacts is highly desirable.

The business of fabricating CMOS semiconductor devices is a very competitive, high-volume business. Thus manufacturing efficiency is highly important. Product quality and reliability are also highly important. It is well-known in the art that reducing the number of mask steps in the integrated circuit manufacturing process not only reduces manufacturing costs and time but also generally increases the quality and reliability of the end product, since the opportunities for disabling defects to occur are reduced. This in turn feeds back into further reduced manufacturing costs since scrapped product is reduced. Thus, a circuit structure and process that not only permits more compact devices but also reduces the number of fabrication steps, particularly the number of mask steps, would be a significant advance in the art.

One approach to solving the above problems in a state-of-the-art DRAM fabrication process is described in "A 1.28 $\mu m^2$ Bit-line Shielded Memory Cell Technology for 64 Mb DRAMs", by Y. Kawamoto et al, in *IEEE* 1990 *Symposium on VLSI Technology*, pp. 13-14. This fabrication uses a single photo step to define the storage node contacts and storage poly. This results in a reduced number of mask steps. However, this method also results in a buried bit-line which requires that the bit line be subjected to the subsequent steps in forming the capacitor which generally includes high temperature. Thus the bit line must be formed out of a temperature-resistant material, such as a silicide, which has higher resistance than a metal such as aluminum or tungsten and thus reduces the speed of the DRAM. In addition, the use of a silicide bit line requires two additional photo steps. i.e. the A.A. to silicide bit line contact photo and the silicide bit line photo.

Another approach is disclosed in "Two step Deposited Rugged Surface (TDRS) Storagenode and Self-Aligned Bitline-Contact Penetrating Cellplate (SAB-PEC) for 64 Mb DRAM STC Cell" by H. Itoh et al. in *IEEE* 1991 *Symposium on VLSI Technology*, pp. 9-10. See also "A Novel Zero-overlap/Enclosure Metal Interconnection Technology For High Density Logic VLSI's", by H. Shibata al. in *IEEE Jun.* 12-13 1990 *VMIC Conference*, pp. 15-21. The process and structure disclosed in the H. Itoh reference solves some of the above problems by utilizing a bit line contact that passes through the cell poly, since this technology allows the bit line is formed after the capacitor. However, to insulate the bit line from the cell poly, two layers of insulation must be formed between the word lines, i.e. the word line spacers and the cell poly spacers. This greatly narrows the well for the bit line, and as a result the process is forced to use a poly/silicide bit line since metal would not properly fill such a narrow well. This again requires two additional photo steps. Moreover, in 64 Mbit DRAM technology the gap between the word line spacers is only about 0.2 $\mu m$ prior to the bit line contact definition. Thus the well between the spacers would be completely closed off with any cell poly oxide spacer thickness greater than 0.1 $\mu m$. A spacer this thin is very difficult to form, and would likely result in an unacceptably large number of devices with cell-poly-to-bit-line current leakage. The H. Shibata reference shows a contact plug that penetrates several fabrication layers to contact active areas. The reference discloses polysilicon spacers that do not close off the gaps between transistor gates on either side of the active areas, but would not apply to bit line contacts in DRAM technology as the poly spacers would short the bit line to the cell poly. Further, the approach by Shibata does not self-align the contact with respect to the transistor poly (word lines) and would require the word lines to be spread further apart at the bit contact to allow for misalignment.

A further approach is disclosed in U.S. Pat. No. 5,045,899 issued to Arimoto. This shows a DRAM fabrication process (see FIG. 12 in Arimoto) in which all the oxide is removed prior to deposition of the cell poly. This process does not utilize a self-aligned penetrating bit line contact. Thus it will result in a larger cell size for a given photolithographic capability. Thus a need exists for a DRAM structure and fabrication process which utilizes a self-aligned penetrating bit contact and a reduced number of photo-mask steps, and which is scalable and can utilize metal bit line contacts because it does not close off the gap between the word line spacers in 64 Mbit DRAMs.

3. Solution to the Problem

The present invention provides a method of integrated circuit fabrication that utilizes a single etch stop layer to form three different self-aligned contacts. In DRAM, the single etch stop layer is used to form metal to A.A. contacts that are self aligned to the transistor poly, to form storage poly contacts that are self aligned to the word line poly, and also to form metal 1 to transistor poly contacts without any additional steps.

In providing the above structure and process, the invention provides an integrated circuit that utilizes contact-through-cell-poly technology while also providing a method of making metal-to-cell-poly contacts with no additional photo/etch steps.

The invention further provides an efficient integrated circuit structure and process that, when the overall process is considered, requires fewer mask steps; in particular it provides a structure and o process for making compact multi-megabit DRAM with minimal masking steps which exploit self alignment of multiple elements and provides large cell capacitance for a given cell area.

The present invention is particularly applicable to DRAM in that it provides a process for efficiently forming multiple contacts in combination with a capacitor of large area. However, once its use in DRAM is understood, it is evident that it can be applied in other circuits also.

SUMMARY OF THE INVENTION

The invention provides a method of fabricating a integrated circuit dynamic random access memory (DRAM), the DRAM comprising a semiconducting wafer having a semiconducting substrate, a plurality of transistors formed on the substrate, each transistor including a gate conducting layer, a capacitor formed on the substrate and having a capacitor first conducting layer, a capacitor dielectric layer, and a capacitor second conducting layer, an active area on the substrate adjacent one of the transistors, a bit line contact contacting the active area, and a gate contact contacting the gate conducting layer, the method comprising the steps of: employing a first etch stop layer to self align the capacitor first conducting layer contact to the gate conducting layer; employing the first etch stop layer to self align the bit line contact to the gate conducting layer; and utilizing a single photo-mask and etch process to o define the bit line contact and etch to the active area and to define the gate contact and etch to the gate conducting layer. Preferably, the step of utilizing further comprises utilizing the single photo-mask and etch process to define a capacitor second conducting layer contact and etch down to the capacitor second conducting layer.

In another aspect the invention provides a method of fabricating a integrated circuit dynamic random access memory (DRAM), the DRAM comprising a semiconducting wafer having a semiconducting substrate, a plurality of transistors formed on the substrate, each including a gate conducting layer, a capacitor formed on the substrate and having a capacitor first conducting layer, a capacitor dielectric layer, and a capacitor second conducting layer, an upper insulating layer covering the capacitor second conducting layer, an active area on the substrate adjacent one of the transistors, a bit line contact contacting the active area, a gate contact contacting the gate conducting layer, and a capacitor conducting layer contact, the method comprising the step of: providing a single photo-mask; creating a resist layer on the wafer and using the single photo-mask to pattern the resist layer to define the bit line contact and the capacitor conducting layer contact; etching the pattern into the upper insulating layer and through the capacitor second conducting layer to the active area to form a bit line contact region while etching the pattern into the upper insulating layer to the capacitor second conducting layer to form a capacitor second conducting layer contact region. Preferably, the DRAM also includes a lower insulator layer between the active area and the o capacitor second conducting layer in the bit line contact region, which lower insulator layer etches similarly to the upper insulating layer, and wherein the step of etching comprises: etching through the upper insulating layer to the capacitor second conducting layer in the bit line contact region while etching through the upper insulating layer stopping short of the capacitor second conducting layer in the region of the capacitor conducting layer contact region; etching through the capacitor second conducting layer in the bit line contact region; and etching through the lower insulating layer in the bit line contact region while completing the etch through the upper insulating layer to the capacitor second conducting layer in the region of the capacitor conducting layer contact region.

In a further aspect the invention provides a method for fabricating an integrated circuit comprising the steps of: a) providing an integrated circuit wafer having: a semiconducting substrate; a plurality of transistor gate members each comprising a gate insulating layer formed on the substrate and a gate conducting layer on the gate insulating layer; and first and second active areas on the semiconducting substrate: b) forming a first etch stop layer on the wafer, covering the transistor gate members and the active areas; c) creating a lower insulating layer on the wafer; d) utilizing a first photo-mask and etch process to define a capacitor container in the lower insulating layer and the first etch stop layer above the first active area and a gate conducting layer contact region in the lower insulating layer and the etch stop layer above a first transistor gate member; e) forming a capacitor first conducting layer in the capacitor container and in the transistor gate conducting layer contact region, the capacitor first conducting layer in electrical contact with the first active area; f) forming a capacitor dielectric layer on the capacitor first conducting layer; g) forming a capacitor second conducting layer on the capacitor dielectric layer; h) utilizing a second photo-mask and etch process to remove the capacitor second conducting layer, the capacitor dielectric layer, and the capacitor first conducting layer from the gate conducting layer contact region; i) creating an upper insulating layer on the wafer; j) utilizing a third photo-mask and etch process to define a bit line contact region above the second active area and to define a gate conducting layer contact region above the first transistor gate member; k) creating a capacitor insulating spacer between the capacitor layers and the bit line contact region; and l) creating a bit line contact in electrical contact with the second active area and a gate conducting layer contact in electrical contact with the gate conducting layer of the first transistor gate member. Preferably, the step of utilizing a first photo-mask and etch process further comprises utilizing the first photo-mask and etch process to define a capacitor conducting layer contact region in the lower insulating layer and the first etch stop layer; the step of utilizing a third photo-mask and etch process further comprises utilizing the third photo-mask and etch process to define a capacitor conducting layer contact region in the upper insulating layer; and the method further comprises creating a capacitor conducting layer contact in electrical contact with the capacitor second conducting layer. Preferably, the step of utilizing a third photo-mask and etch process further comprises: etching through the upper insulating layer to the capacitor second conducting layer above the second active area while stopping the etch short of the capacitor second conducting layer in the region of the capacitor conducting layer region; etching through the capacitor second conducting layer above the second active area; and etching through the lower insulating layer above the second active area while completing the etch through the upper insulating layer to the capacitor second conducting layer in the region of the capacitor conducting layer contact region. Preferably, step j) comprises etching through the upper insulating layer, the capacitor second conducting layer, the capacitor dielectric layer, the lower insulating layer, and the first etch stop layer to the second active area; and step k) comprises: depositing an insulating film on the wafer; and preferably etching the insulating film to expose the second active area while leaving the capacitor insulating spacer covering the capacitor second conducting layer. Alternatively, a second etch stop layer is formed on the wafer between steps i) and j); step j) comprises etching through the second etch stop layer, the upper insulating layer, and the capacitor second conducting layer; and step k) comprises: forming a third insulating layer on the wafer; preferably etching through the third insulating layer and the lower insulating layer to the first etch stop layer in the bit line contact region while stopping on the second etch stop layer adjacent the bit line contact region and leaving the third insulating layer covering the capacitor second conducting layer along the sides of the bit line contact region; and etching through the first etch stop layer. Preferably, the first etch stop layer is made of aluminum oxide. Alternatively, each of the transistor gate members further comprise an insulating layer on the gate conducting layer, the integrated circuit wafer includes a transistor insulating spacer member separating each of the active areas and the transistor members, and the insulating layer on the gate conducting layer, the transistor insulating spacer member, and the first etch stop layer are made of silicon nitride.

The invention also provides a method of fabricating a bit line contact that penetrates the capacitor cell plate in a stacked capacitor DRAM comprising the steps of: providing a semiconductor wafer comprising: a semiconducting substrate having an active area; a plurality of transistor gate members, one on either side of the active area, a transistor insulating spacer member between the transistor gate members and the active area, a lower insulating layer covering the transistor gate members, the transistor insulating spacer member, and the active area; a capacitor cell plate layer covering the lower insulating layer above the active area; and an upper insulating layer covering the capacitor cell plate layer; utilizing a photo-mask process to define a contact region penetrating the upper insulating layer, the capacitor cell plate layer, and the lower insulating layer above the active area, the contact region being wider than the distance between opposite sides of the transistor spacer member across the active area, and creating a third insulating layer on the wafer, the third insulating layer extending from the sides of the contact region sufficiently far to overhang the transistors; performing an anisotropic etch of the third insulating layer to expose the active area while forming a capacitor insulating spacer member covering the capacitor cell plate layer on the walls of the contact region, the opening between opposing sides of the capacitor spacer member being as great or greater than the width of the active area between opposing sides of the transistor spacer member; and forming a bit line contact in the contact region. Preferably, the method of fabricating a bit line contact further includes the step of creating an upper insulating layer etch stop layer over the upper insulating layer, and the step of utilizing further comprises utilizing the photo-mask process to define the contact region penetrating the upper insulating layer etch stop layer. Preferably, the step of utilizing a photo-mask process to define a contact region and creating a third insulating layer on the wafer comprises: utilizing the photo-mask process to define the contact region penetrating the upper insulating layer etch stop layer, the upper insulating layer, and the capacitor cell plate layer above the active area; creating the third insulating layer on the wafer, the third insulating layer made of a material that etches similarly to the lower insulating layer; and performing an anisotropic etch of the third insulating layer and the lower insulating layer to expose the active area while leaving the capacitor insulating spacer covering the capacitor conducting layer on the walls of the contact region, the upper insulating area etch stop layer serving as an etch stop on either side of the contact region. The invention also provides method of fabricating a capacitor insulating spacer for a contact that passes through a capacitor cell conducting layer in an integrated circuit DRAM, the method comprising: providing a semiconductor wafer comprising: a semiconducting substrate having an active area; a plurality of transistor gate members, one on either side of the active area, a transistor insulating spacer member between each of the transistor gate members and the active area, a lower insulating layer covering the transistor members, the transistor insulating spacer member, and the active area; a capacitor conducting layer covering the lower insulating layer above the active area; and an upper insulating layer covering the capacitor conducting layer; creating an upper insulating layer etch stop layer over the second insulating layer; utilizing a photo-mask process to define a contact region penetrating the upper insulating layer etch stop layer, the upper insulating layer, and the capacitor conducting layer above the active area; creating a third insulating layer on the wafer, the third insulating layer made of a material that etches similarly to the lower insulating layer; and performing an anisotropic etch of the third insulating layer and the lower insulating layer to the active area while leaving the capacitor insulating spacer covering the capacitor conducting layer on the walls of the contact region, the upper insulating area etch stop layer serving as an etch stop on either side of the contact region. Preferably, the semiconductor wafer includes an active area etch stop layer between the lower insulating layer and the transistor gate members, transistor spacer, and active area and the step of performing an isotropic etch comprises etching the third insulating layer and lower insulating layer with a first etch and then etching the active area etch stop layer with a second etch. Preferably, the contact region is sufficiently wide so the opening between opposing sides of the capacitor spacer member is as great or greater than the width of the active area between opposing sides of the transistor spacer member.

The invention not only provides a simplified method off making DRAMs with less mask steps and a significant amount of self alignment, but it also provides an integrated circuit structure that is more compact than prior art DRAMs and can be used in multi-megabit DRAMS Numerous other features, objects and advantages of the invention will become apparent from the following description when read in conjunction with the accompanying drawings.

BRIEF DESCRIPTION OF THE DRAWINGS

FIG. 6A shows a cross-sectional view of a portion of the DRAM wafer of FIG. 5 following deposition of the cell dielectric and cell poly, and a photo-mask step to form a cell poly resist pattern;

FIG. 6B shows a cross-sectional view of the portion of the Dram wafer of FIG. 6A following selective etches of the cell poly, cell dielectric and storage poly, and, optionally, the insulator above the transistor poly in the are of the future transistor poly contacts;

FIG. 7 is a cross-sectional view of another portion of the DRAM wafer of FIG. 6A showing the metal 1 to cell poly contact region at the same stage in the fabrication process;

FIG. 8 is a cross-sectional view of an alternative embodiment of the DRAM wafer of FIG. 6A showing an alternative structure for the future metal to poly 1 contact region at the same stage of the fabrication process;

FIG. 9 is a cross-sectional view of the DRAM wafer of FIG. 6B following a resist strip, a thick insulator deposition and planarization, a photo-mask step, a nitride etch, a timed oxide etch to reach the cell poly in the future bit line contact region, and then a poly etch through the cell poly;

FIG. 13 is a cross-sectional view of an alternative preferred embodiment of the invention in which after the steps of FIG. 6B and the following resist strip, the thick insulator has been deposited and planarized, then a poly layer has been deposited, patterned in a photo-mask step and etched, the thick insulator etched to the cell poly, the cell poly has been etched, the resist stripped, and an capacitor insulating spacer layer has been deposited;

FIG. 14 is a cross-sectional view of the DRAM wafer of FIG. 13 following etch of the capacitor insulating spacer layer to form the cell poly spacers;

DESCRIPTION OF THE PREFERRED EMBODIMENT

1. Overview

Figure 1:
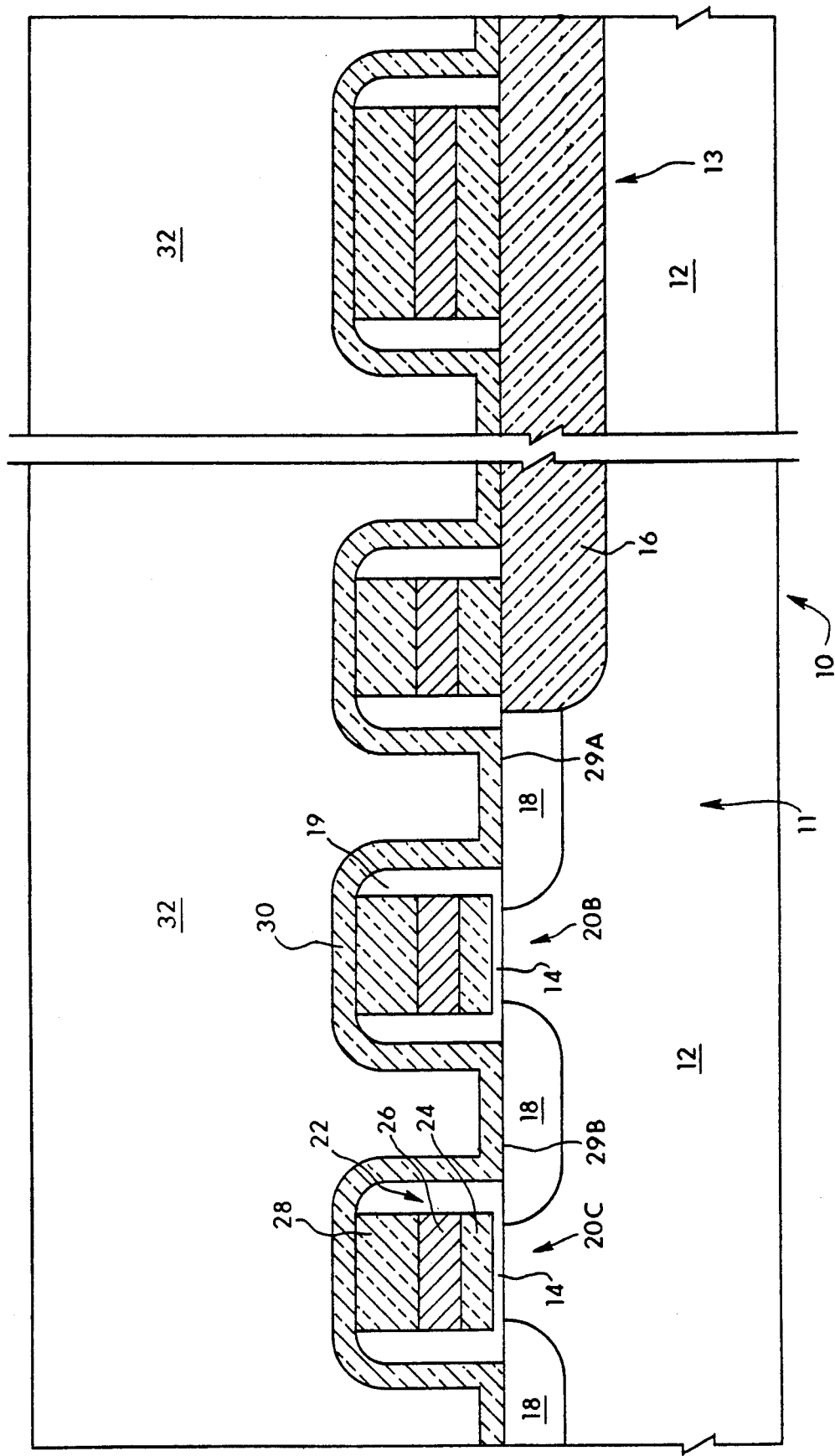
FIG. 1 shows a cross-sectional view of a portion of a partially fabricated DRAM integrated circuit according to the preferred embodiment of the invention comprising a silicon substrate that has been oxidized, and following the formation of doped wells, field oxide regions, transistors, an insulating layer over the transistor gates, insulating spacers on either side of the transistors, and an etch stop layer.
Figure 10:
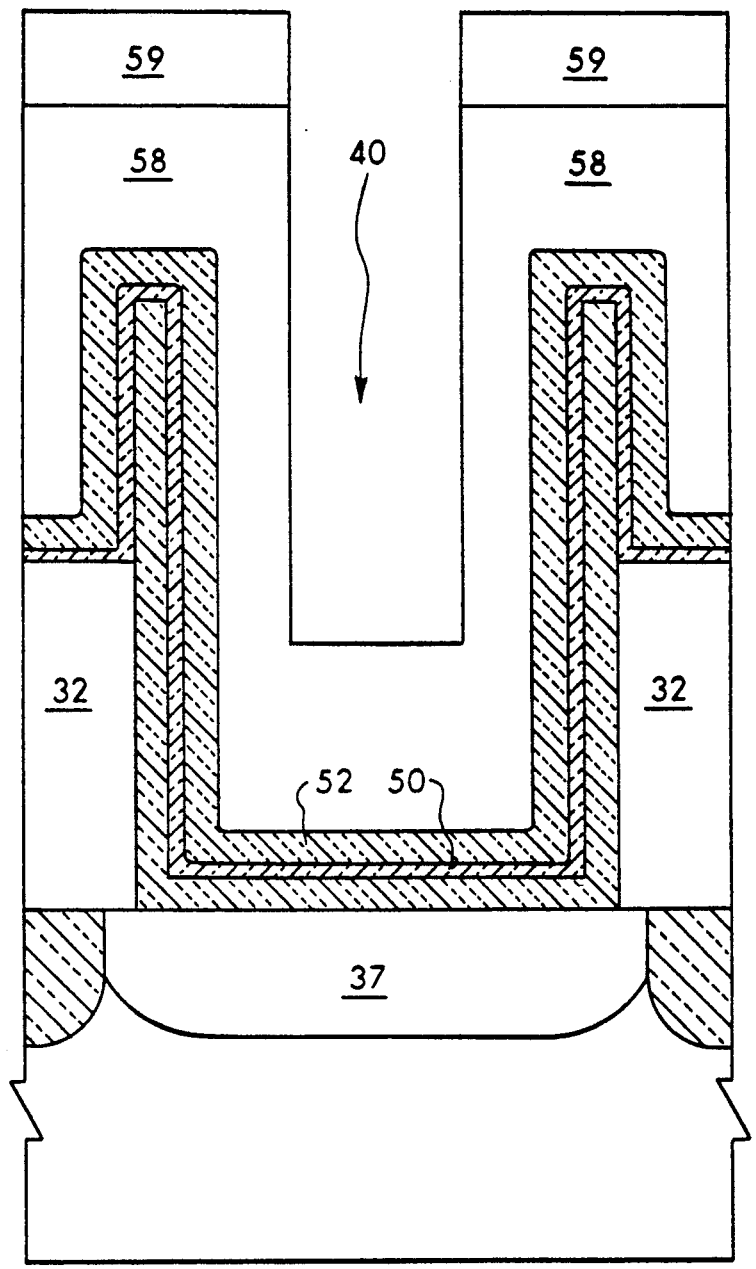
FIG. 10 is a cross-sectional view of another portion of the DRAM wafer of FIG. 9 showing the metal 1 to cell poly contact region at the same stage in the fabrication process.

Turning now to FIG. 1, an integrated circuit wafer 10 according to the invention in an early stage of fabrication is shown. It should be understood that the figures are not meant to be actual cross-sectional views of any particular portion of an actual semiconducting device, but are merely idealized representations which are employed to more clearly and fully depict the process of the invention than would otherwise be possible. Wafer 10 includes an array region 11, which includes many identical cells (one cell shown), and a periphery area 13 in which the metal to poly 1 contacts will be located. Wafer 10 comprises a conventional silicon substrate 12 having a thin gate oxide layer 14, thick field oxide areas 16, doped wells, such as 18, transistor gate members 20B, 20C, transistor insulating spacer members, such as 19, on either side of each transistor gate member, such as 20B, and a thick insulating layer 32 in which the capacitors 31 (FIG. 6A), 140 (FIG. 14) and contacts 100 (FIG. 16) of the device will be formed. The invention provides a structure and process in which a single etch stop layer 30 is utilized in self aligning the future storage poly contact regions 41 (FIG. 3), the future bit line contact regions 36 (FIG. 11) with respect to the transistor poly 24. The bit line contact regions 36 penetrates the cell poly 52 and is thus self-aligned with respect to the cell poly 52. The future metal to transistor poly contact regions 38 (FIG. 11), and the future cell poly contact regions 40 (FIG. 7) .are made with no additional masking steps, but by utilization of the storage poly 42 definition in these locations in conjunction with a sequential etch after the cell poly photo. At the same time the process and structure of the invention also utilizes only three photo-mask steps: one to define the storage poly contact regions 41 and future metal to transistor poly contact regions 38 (FIG. 2), and the future cell poly contact regions 40 (FIG. 7); a second to cut through the capacitor layers outside the array where the cell poly is to be removed (FIG. 6B), and a third to cut through the cell poly 52 in the future bit line contact regions 36 (FIG. 9) and the peripheral active area contact regions and to reopen the future transistor poly contact regions 38 and cell poly contact regions 40 (FIG. 10). Thus only three mask steps are used to fabricate elements of the DRAM circuit that require five or more photo-mask steps to fabricate in prior art processes.

2. Detailed Description of the Fabrication

Turning now to a more detailed description of the invention, FIG. 1 shows a cross-section of a preferred embodiment of an integrated circuit wafer 10 in a stage just prior to the first of the photo-mask steps mentioned above. The wafer 10 preferably comprises a lightly doped P-type single crystal silicon substrate 12 which, in well-known processes, has been oxidized to form a thin gate insulating layer 14 and thick field oxide regions 16, and exposed to implantation processes to form areas 18 of N+ doping. Transistor gate members 20B, 20C comprising gate insulating oxide layer 14, a gate conducting layer 22, sometimes referred to as the word line in The DRAM structure, and an insulating protective layer 28. The gate conducting layer 22, or word line, preferably comprises a polysilicon layer 24, referred to alternatively as the transistor poly or poly 1 herein, and a tungsten silicide ($WSi_x$) layer 26. Gate insulating protective layer 28, preferably silicon oxide, has been formed on top of the silicide layer 26 and transistor insulating spacer members 19, preferably silicon oxide, have been formed on either side of each of transistor gate members 20B, 20C. A thin first etch stop layer 32, preferably aluminum oxide ($Al_2O_3$), has been deposited over the wafer, covering the transistor gate members 20B, 20C, spacer members 19, and active areas 29A, 29B between the transistor gate members. The DRAM capacitors 31 will contact some of these active areas, which we shall call the first active areas 29A (FIG. 6A), and the bit line contacts will contact other of these active areas, which we shall refer to as the second active areas 29B. Then a thick lower insulating layer 32, preferably boro-phospho-silicate glass (BPSG), has been deposited and planarized, preferably with a CMP (Chemical Mechanical Polish) process. It should be understood that in the above discussion and in the discussion following, some well-known aspects have been simplified in order to not unduly complicate the discussion. For example, the structure of the doped areas, such as 18, generally will be more complex than shown. In addition, the particular materials, structures and process are intended only to illustrate the invention so that it can be fully and clearly understood. A wide range of other materials, structures and process may be substituted for the particular ones presented and still be within the contemplation of the invention. For example, in one preferred embodiment, silicon nitride ($Si_3N_4$) is used instead of silicon oxide for the protective insulating layer 28 and spacer members 19 and also may be used for the etch stop layer 30. Or SOG (Spin-On-Glass), PI (Polyamide Insulator), CVD (Chemical Vapor Deposited) oxide or other insulators may be used in place of the BPSG insulator 32. Any other satisfactory materials may be substituted for any of the above. Or, additional materials, structures and processes may also be added to those disclosed. For example, a thin oxide insulator may be deposited over the active areas 29A, 29B to prevent the etch of the etch stop layer 30 from stopping on the silicon of the active areas.

Figure 2:
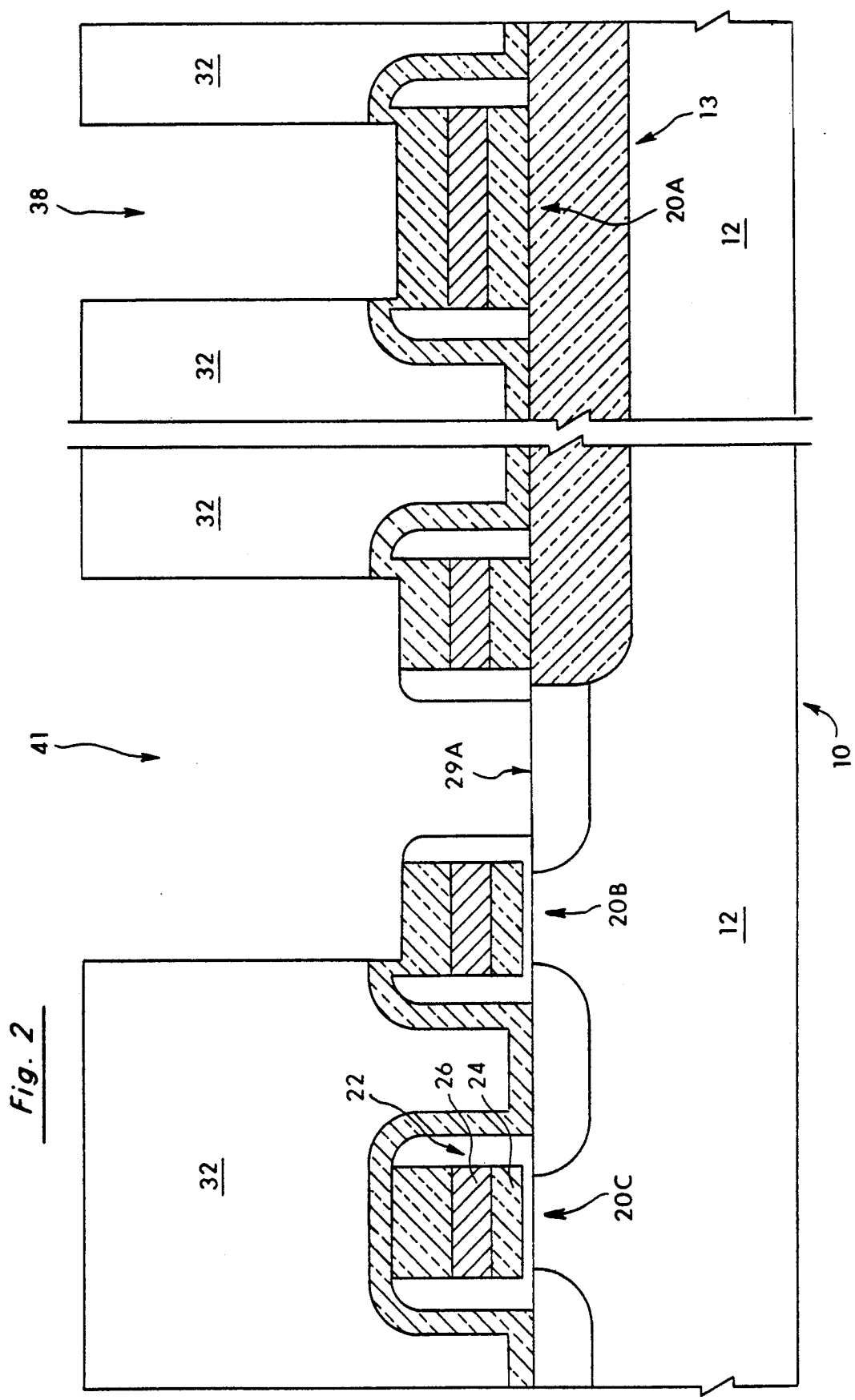
FIG. 2 is a cross-sectional view of a portion of the DRAM wafer of FIG. 1 following the deposition of a thick insulating layer, planarization of the insulating layer, a photo-mask step followed by a selective oxide etch to open holes for the storage poly, the future metal to poly 1 contacts, and the future metal to cell poly contacts, a plasma etch of the etch stop layer, and a resist strip.

Turning now to FIG. 2, the wafer 10 is subjected to the storage node poly photo-mask process, sometimes called the "container" photo process as it opens the holes 41 in the insulating film 32 which will contain the storage capacitor. In the method according to the invention if also provides regions, such as 38, where future contacts will be located. First a conventional resist layer (not shown) is deposited followed by a conventional photo-mask process to open holes or containers 41 in the resist where the storage poly 42 will go, to open holes 38 in the resist where the future metal to transistor poly contacts will go, and to open holes 40 in the resist where the future metal to cell poly contacts will be located (FIG. 7). Optionally, an isotropic $O_2$ plasma etch may be performed to widen the resist openings and increase the storage poly area beyond the limitations of the photo resolution. Then the wafer is subjected to an anisotropic oxide etch, preferably an RIE (Reactive Ion Etch), referred to herein as a "first etch process" which etches through the film 32 to stop completely on the etch stop layer 30. The etch stop is selectively etched using a "second etch process" to expose the silicon substrate 12 at the first active areas 29A which the storage poly 42 will contact, to expose the first transistor gate members 20A, where the future transistor poly contacts will be located, and to expose the active area 29C (FIG. 7) where the future cell poly contacts will be located. These etches form the capacitor containers 41 in which the future capacitors will be located, the transistor poly regions 38 or, more broadly, the gate conducting layer contact regions 38, where the future contacts to the transistor gate conducting layers 22 will be formed, and the cell poly contact regions 40 (FIG. 7), or, more broadly, the capacitor conducting layer contact regions 40, where the contacts to the second capacitor conducting layer 52 will go. After the containers and regions are formed, the resist is stripped.

Figure 3:
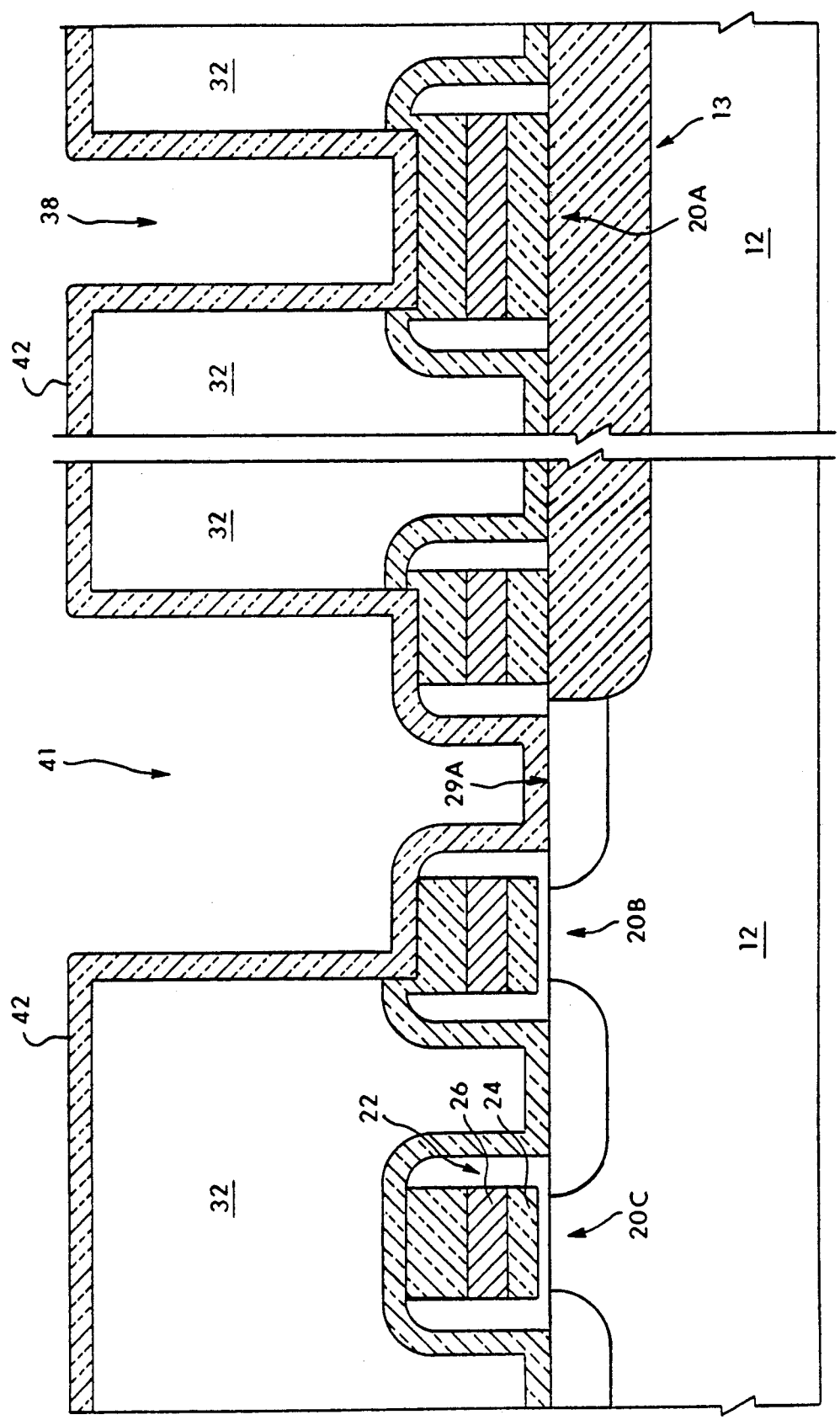
FIG. 3 is a cross-sectional view of a portion of the DRAM wafer of FIG. 2 following storage poly deposition.
Figure 4:
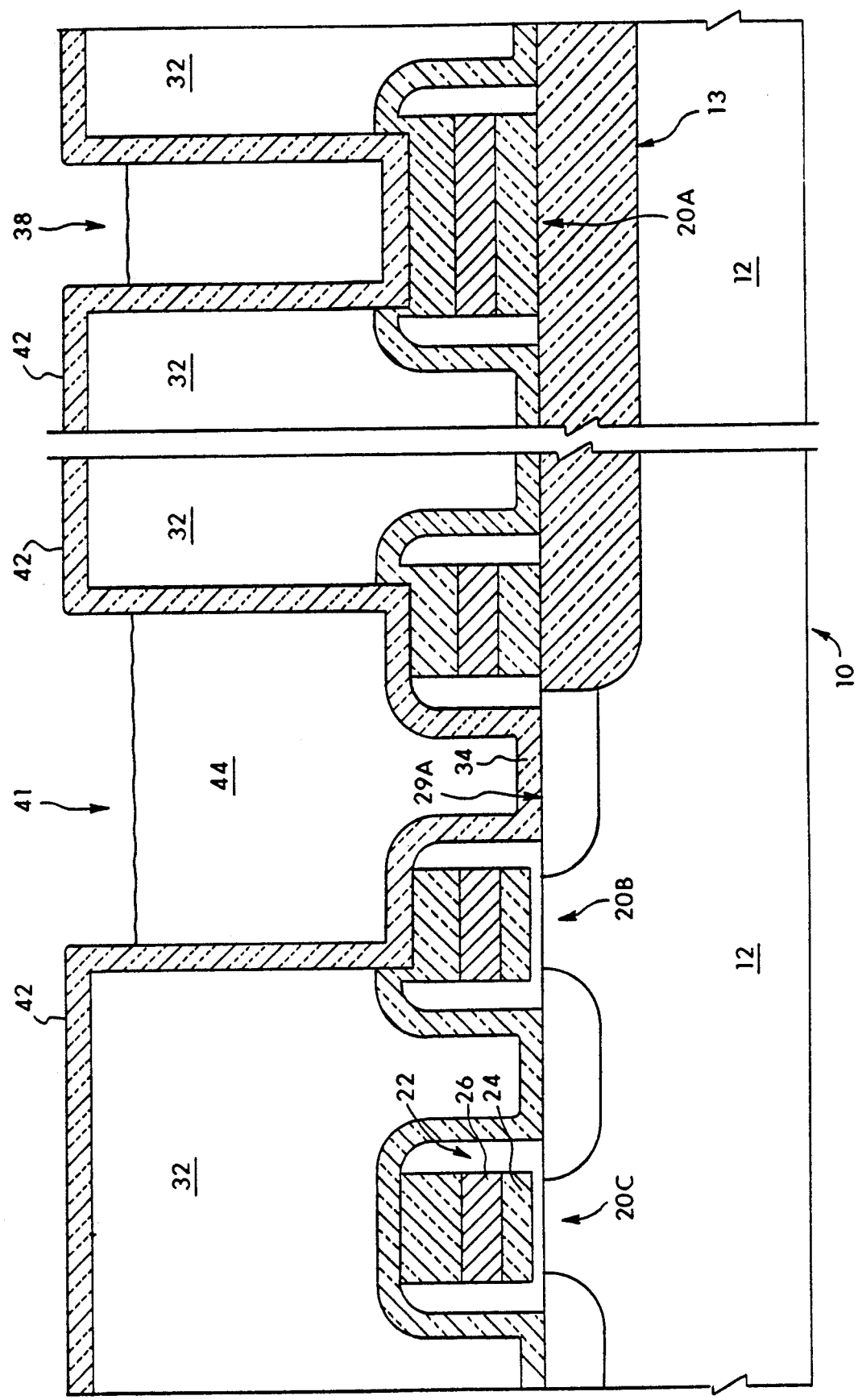
FIG. 4 is a cross-sectional view of a portion of the DRAM wafer of FIG. 3 following a resist deposition and partial etch of the resist.

Turning to FIG. 3, the storage poly 42, sometimes referred to herein as the capacitor first conducting layer 42, is deposited. Preferably it is insitu doped, rough textured poly which yields increased capacitance. Then, as shown in FIG. 4, resist 44 is spun on the wafer 10 and then partially etched in a blanket $O_2$ plasma etch to leave the resist 32 only in the containers 41 and regions 38 and 40 as shown in FIG. 4.

Figure 5:
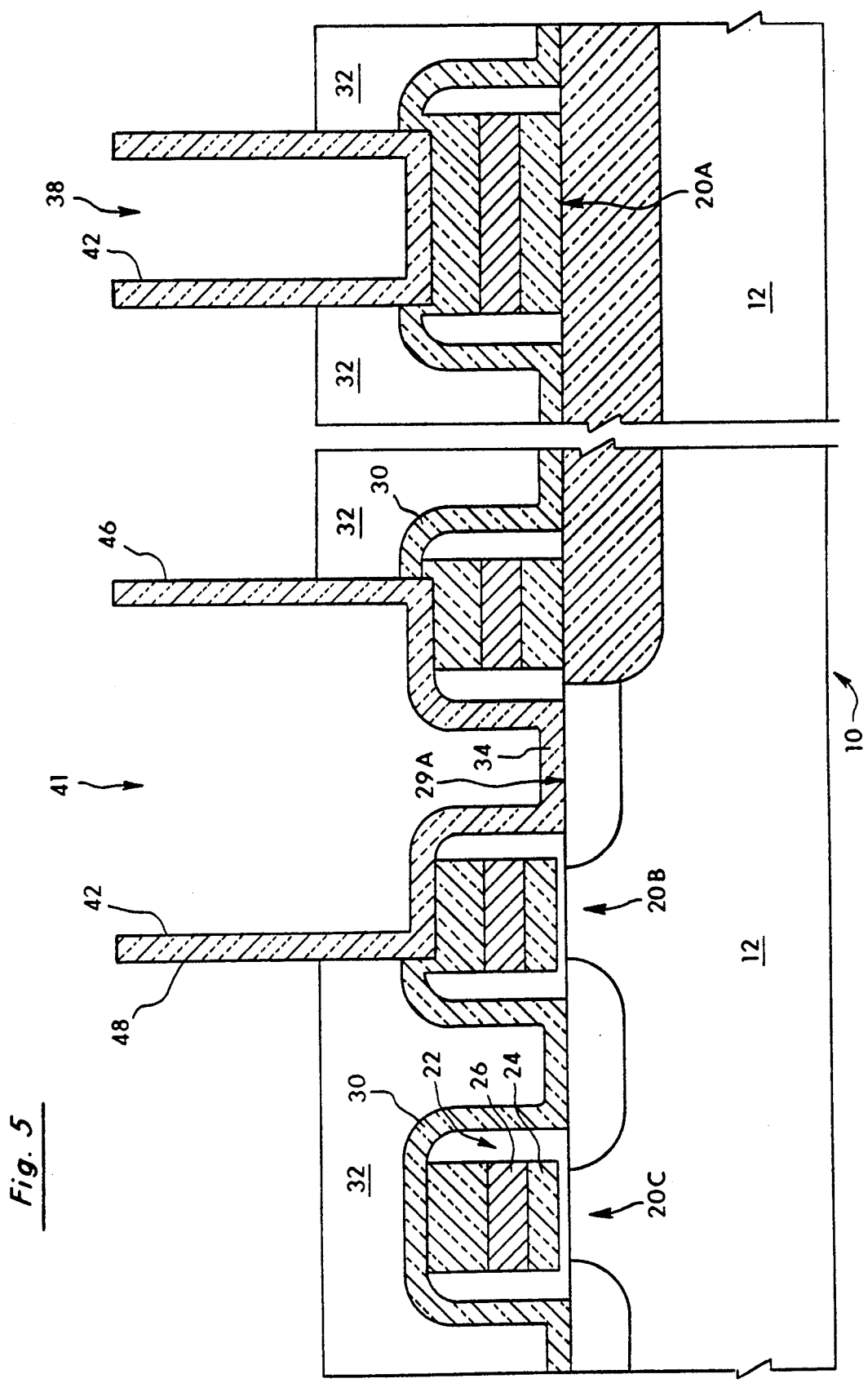
FIG. 5 shows a cross-sectional view of a portion of the DRAM wafer of FIG. 4 following a partial etch of the storage poly, a controlled oxide etch, and a strip of the resist.

FIG. 5 shows the next step, which preferably is a blanket poly etch which isolates the storage poly nodes 46. It is noted that the invention also contemplates that this etch step may be eliminated and replaced with a CMP isolation of the storage poly as will be discussed in connection with FIG. 12 below. The blanket poly etch may be followed with an optional partial blanket oxide etch which is selective to poly so as not to etch the exposed storage poly 42. This optional oxide etch exposes much of the outer peripheries 48 of the storage poly 42 which significantly increases the capacitance area of the cell. This etch is preferably a timed etch to a precise depth, though other etch methods that result in an exact depth may be used. This etch is a key aspect of the invention. In the prior art, this etch went all the way through the oxide 32 to the etch stop layer 30 or silicon 12 if no etch stop layer was used. It is critical to the invention that this etch be only a partial etch (or no etch at all), preferably, leaving 0.3 $\mu$m of oxide 32 above the etch stop layer 30 overlying the transistor poly 24. As we shall see below, this partial etch allows a single photo-mask step to define the bit contacts, the poly 1 contacts and the cell poly contacts. After this etch the resist 44 is then stripped.

FIG. 6A shows the structure resulting from the next stages of fabrication for the portion of the wafer 10 shown in FIG. 5, and FIG. 7 shows the structure resulting from these same stages at a future metal to cell poly contact, which is located in the corners of the array. The capacitor dielectric 50, sometimes referred to herein as the cell dielectric 50, is deposited. The cell dielectric 50 is preferably silicon oxide, though it may also be silicon nitride or other insulating material. If silicon nitride is selected, an optional wet oxidation may follow for improved defect density. The cell poly, or capacitor second conducting layer 52, often referred to in the art as the "cell plate" is then deposited, which is preferably insitu-doped poly. The cell poly resist 54 is deposited, and then the second photo-mask step defines the cell photo pattern. In the embodiment shown in FIGS. 6 and 7, the array 11 is left fully covered including the location 36 of the future bit line contact.

FIG. 8 shows an alternative embodiment of the future metal to transistor poly (poly 1) contact region 38A. In this embodiment more of the area around the contact was exposed in the first photo-mask step with the result that more of the etch stop layer 30 was removed and the storage poly 42, cell dielectric 50 and cell poly 52 covers a wider area. This embodiment results in a larger metal to poly 1 contact area which is less likely to be closed off by a subsequent oxide deposition which isolates the cell poly and which will be discussed below.

Referring now to FIG. 6B, there follows an isotropic cell poly etch, an isotropic cell dielectric etch, an isotropic storage poly etch, and an optional anisotropic etch of insulator 28 in the area 38 of the future transistor poly (poly 1) contacts and the peripheral active area contacts, which remove the cell poly, cell dielectric, storage poly and the insulator 28 respectively from the areas 38 and 38A of the future metal to poly 1 contacts. Turning now to FIGS. 9 and 10, the resist is stripped followed by a blanket deposition of upper insulating layer 58, preferably BPSG oxide, which is followed by a planarization, preferably CMP. Then follows the third or contact photo process, defining the bit line contact regions 36, and redefining the metal 1 to poly 1 contact regions 38 around the periphery of the array, and the cell poly contact regions 40 (FIG. 10). Then follows a timed oxide etch to a depth of $1.0+/-0.2$ $\mu$m. This oxide etch will ensure that the cell poly 52 is reached at the bit line contact regions 36 but will not be deep enough to reach the cell poly in the metal 1 to cell poly contact regions 40 (FIG. 10) or the transistor poly in the metal 1 to transistor poly contact regions 38. This oxide etch process shall be referred to herein as a first etch process, in contradistinction to the etch process that etches the etch stop layer 30, which will be referred to as the second etch process. It is noted that an etch step which reaches the cell poly 52 in the bit line contact regions 36 but does not reach the cell poly 52 in the metal 1 to cell poly contact regions 40 (FIG. 10) or the transistor poly in the metal 1 to transistor poly contact regions 38 is possible because of the partial etch (or no etch) discussed above in connection with FIG. 5. That partial etch (or no etch) left the cell poly 52 in the region of the bit line contact regions 36 raised above the level of the cell poly in the areas where the storage poly container was patterned, such as in the future metal to cell poly contact regions 40 (FIG. 10). After the oxide etch, the exposed cell poly 52 in the bit line contact containers 36 is then etched through either anisotropically or isotropically to recess it back from the future bit line contact.

Figure 11:
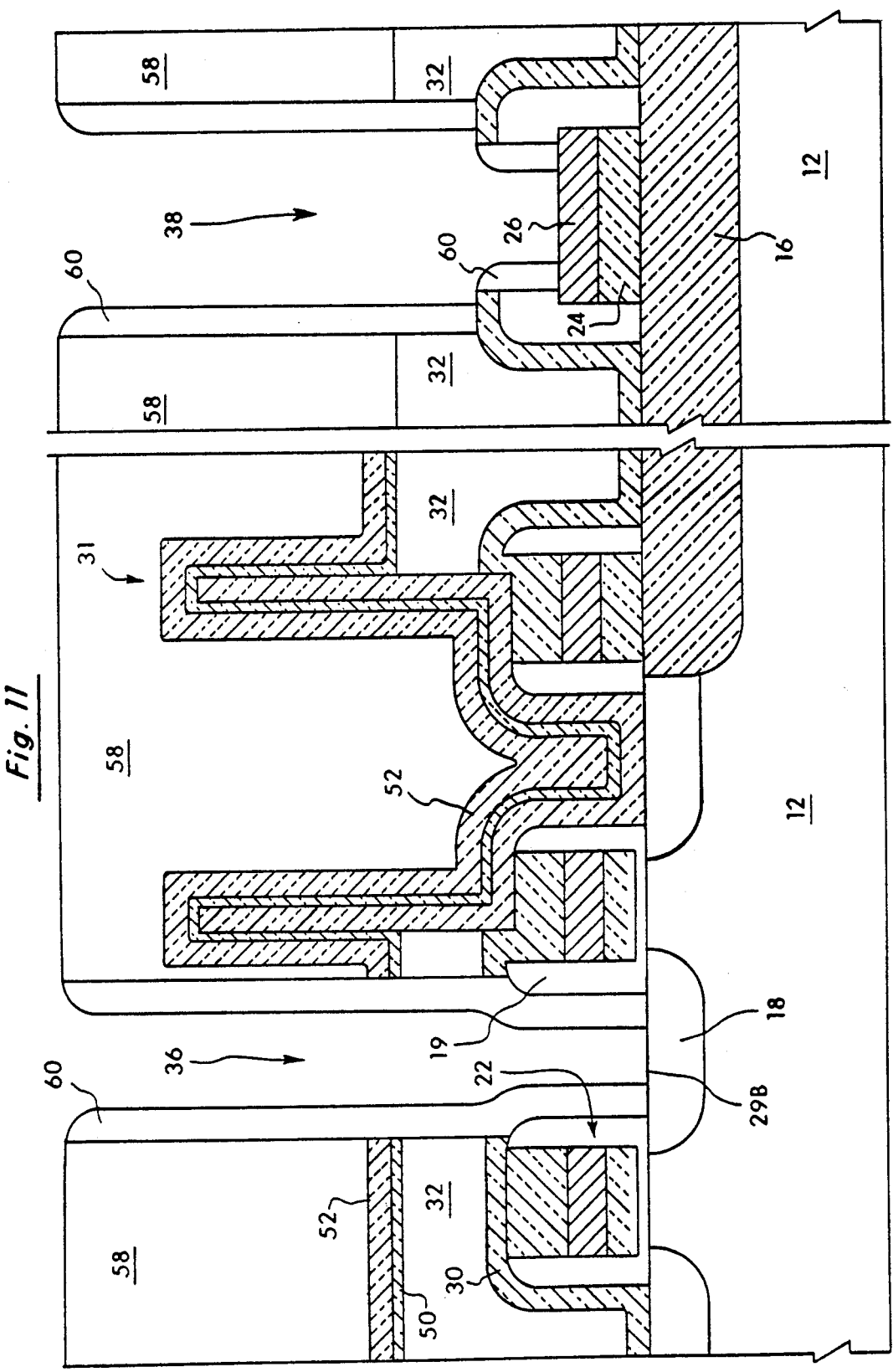
FIG. 11 is a cross-sectional view of the DRAM wafer of FIG. 9 following a further oxide etch, an etch of the etch stop layer, a resist strip, an oxide spacer deposition, and an oxide etch of the spacers.

Referring now to FIG. 11, the contact etch is then switched back to the first etch process, i.e. the oxide etch, stopping on the etch stop layer 30 in the future bit line contact regions 36, on the tungsten silicide 26 in the future metal 1 to poly 1 contact regions 38, and on the cell poly 52 in the future metal to cell poly contact regions 40 (FIG. 10). Optionally, the cell poly can be electrically insulated from the bit line contact by a thermal wet oxidation that oxidizes the cell poly 52 in the exposed areas. The etch stop layer 30 is removed in an second etch process, which, in the preferred embodiment etches $Al_2O_3$ but is selective to silicon and silicon dioxide, to expose second active areas 29B. This is followed by removal of the photo resist 59 (shown in FIG. 9) and then deposition of a third oxide layer, preferably a 0.15 $\mu$m thick CVD oxide, then another oxide etch to form capacitor insulating spacers 60 covering the previously exposed capacitor cell poly 52 in the bit line contact regions 36. Spacers 60 will also be formed in the future poly 1 contact regions 38 and the future cell poly contact regions 40, which is why extra wide areas in these regions, as in FIG. 8, are desirable to prevent any possibility that these regions will be closed off. Alternatively, the final etch of both the insulator 32 below the cell poly (FIG. 9) and the etch stop layer 30 in the region of active area 29B is not performed until after the insulative layer 60 is deposited. This may result in a spacer 60 that travels down the sidewall of the Oxide 58. See the discussion below with respect to FIG. 14. After the formation of spacers 60, there follows conventional contact plug formation and metalization steps, etc. to finish the processing of the wafer 10.

Figure 12:
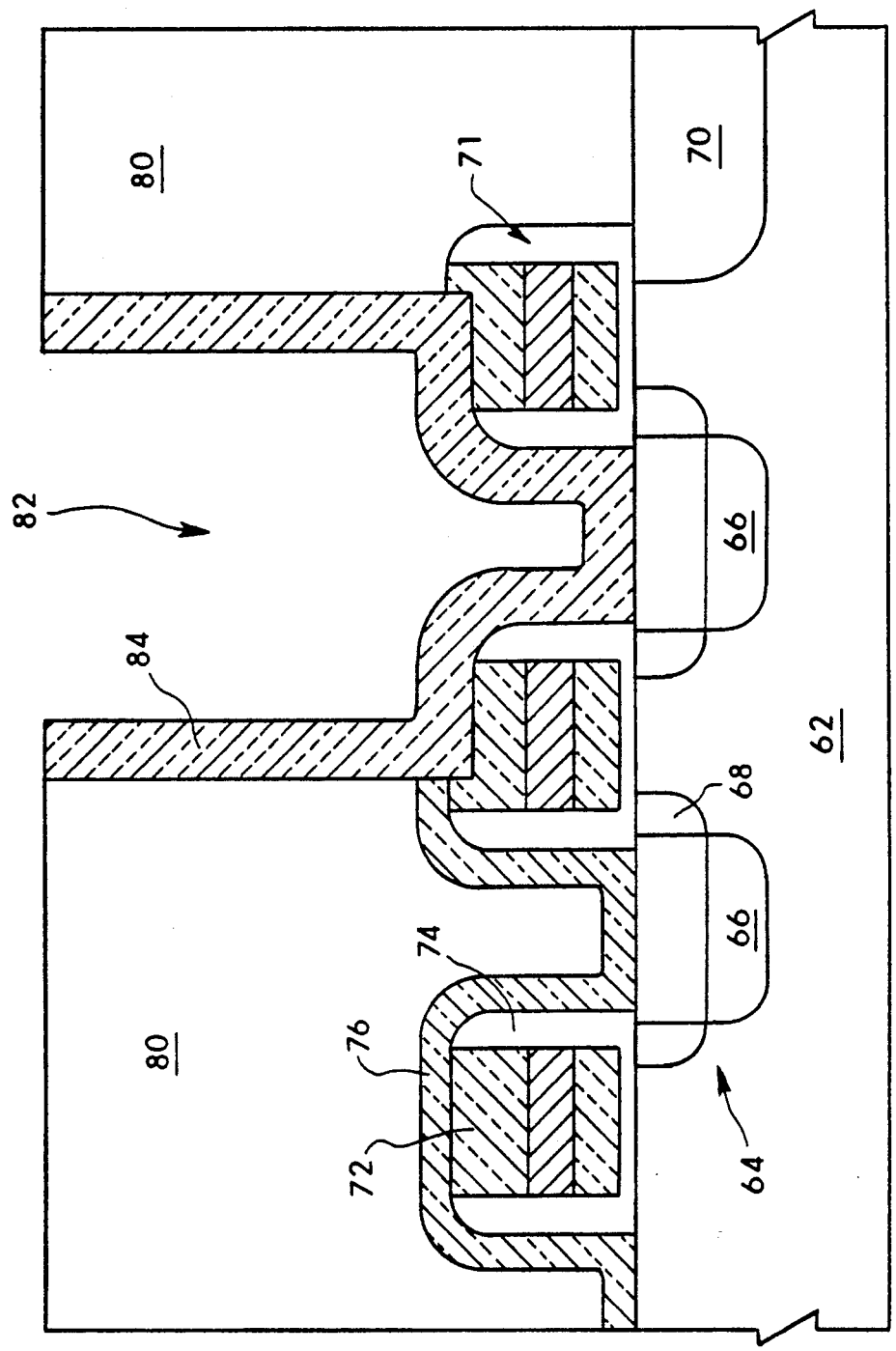
FIG. 12 is a cross-sectional view of an alternative embodiment of the invention at a stage of fabrication comparable to FIG. 5 in which the layer of insulator over the transistor gates, the transistor spacer members, and the etch stop layer are made from nitride, and the storage poly and first BPSG oxide layers have been planarized by a CMP process rather than etched.

Referring now to FIG. 12 a cross-sectional view of an integrated circuit wafer according to an alternative preferred embodiment of the invention just prior to the deposition of the cell dielectric. In this embodiment conventional LDD (Lightly Doped Drains) $N-/N+$ S/D regions 64 and field oxide regions 70 are formed in the lightly P-doped silicon substrate 62. LDD's 64 comprise an $N+$ doped regions 66 and N-doped regions 68. The NMOS and PMOS transistors are formed as in the embodiment of FIG. 1, except here the insulating layer 72 over gates 71, the spacers 74 and the etch stop layer 76 are all preferably made of silicon nitride ($Si_3N_4$). The insulating layer 80 is again preferably BPSG oxide, and a photo-mask step followed by an oxide etch selective to nitride (first etch process) and a nitride etch (second etch process) has defined the storage node container 82. Note that these etch steps can now penetrate into the nitride insulators 72 and spacers 74 without contacting the poly1/$WSi_x$ gates 71. Thus this embodiment provides additional margin for the etch stop layer 76. Following the etches, the storage poly 84 is deposited. In this embodiment, instead of etching the storage poly 84, the storage poly 84 and oxide 80 are isolated in a CMP process. Subsequent steps may be as described above in connection with FIGS. 6-11 or as described below in connection with FIGS. 13-16.

3. Fabrication of the Preferred Bit Line Contact

FIGS. 13 and 14 depict a preferred embodiment of the formation of the bit line contact regions 104 and metal to poly 1 contact regions 86. After deposition of the cell poly 88 and BPSG layer 90, the BPSG is planarized and a second etch stop layer 92 is deposited, which layer 92 is preferably poly silicon, but may also be nitride or any other material that has a good selectivity in the etch of the BPSG layer 32 (FIG. 9) to be described below. The third photo-mask step is then performed to define the regions 104 and 86. At the contact etch step, the poly (or nitride) 92 is etched through, then the BPSG 90 is etched, stopping on the cell poly 88. Then the cell poly 88 is etched through, with either an isotropic or anisotropic etch being used. The resist is then stripped, and third insulating layer 94 is deposited. This is preferably oxide, but may also be nitride.

Referring now to FIG. 14, there follows an oxide etch, preferably an RIE oxide etch, through the cell dielectric 87 and all the way to the etch stop layer 130 or all the way to the silicon 112 if no etch stop layer 130 is used to self align the future bit line contact. Note how the insulating spacers 94 travel down the side wall during this etch. The poly 92 (or nitride) acts as a hard mask during this part of the etch. Etch stop layer 130 is then etched and contact formation and metalization proceeds as before. Preferably in this embodiment the contact photo-mask defines a bit line contact region 104 that is sufficiently wide so the opening between opposing sides of the spacer member 94 is as great or greater than the width of the active area 109A between opposing sides of transistor spacer member 119 and above doped area 118. The advantage of this embodiment of the bit line contact region 104 formation is that when used with an etch stop layer 130, the capacitor insulating spacers 94 will not have a possibility of closing off the bit line contact region 104, and the bit line contact region 104 will be the full width between the word line spacers 119. In addition, the width of the bit line contact region 104 is wider at the top of the region, permitting better step coverage of subsequent conductor deposition for a given contact size.

Figure 16:
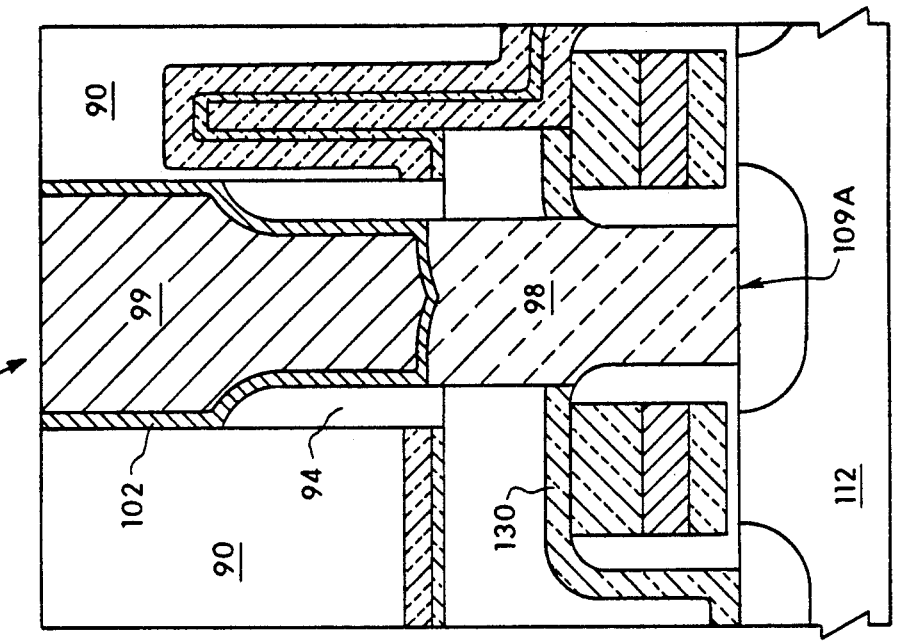
FIG. 16 is a cross-sectional view of the DRAM wafer of FIG. 15 following etch of the poly plug and deposition of a diffusion barrier and tungsten metal plug.
Figure 15:
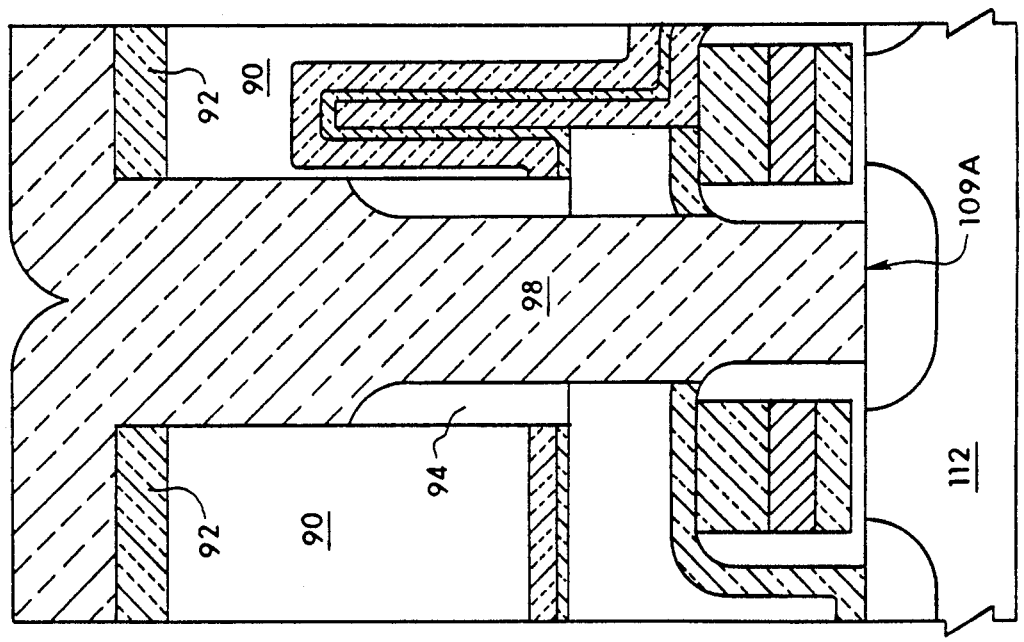
FIG. 15 is a cross-sectional view of the DRAM of wafer FIG. 14 following etch of the etch stop layer and deposition of a poly plug.

Referring now to FIGS. 15 and 16, an alternative embodiment to the conventional metalization structure and process to fabricate the bit line contact 100 is shown. After the etch to the silicon substrate 112, a poly plug 98 is deposited, preferably insitu doped N+poly. Then follows a poly etch to recess the poly plug 98. Next a photo-mask step and etch can be used to open peripheral p+ active area contacts. Then follows the deposition of a diffusion barrier layer 102, preferably titanium nitride (TiN,) although it also may be titanium tungsten (TiW) or any other material used as a diffusion barrier in semiconductor devices. Then a metal plug 99, preferably tungsten, is deposited and planarized, preferably by a CMP process. Then follows conventional metal line deposition steps, etc. to finish the processing.

The particular dimensions of the various layers and parts described above can vary widely depending on a wide variety of factors. The nominal size in the preferred embodiment as well as an approximate range for each of the important dimensions, assuming a 64 Mbit DRAM With about a 1.6 $\mu m^2$ cell, are as follows: the field oxide areas 16, 116, and 70 are nominally about 4000 Å thick, and the gate oxide 14, 114 is nominally about 125 Å thick; the height of the arch of the etch stop layer 30, 130, 76 above the substrate 12, 112, 62 is nominally about 6000 Å; the thickness of the oxide layer 32, 132 between the top of the etch stop layer 30, 130 and the bottom of the cell poly 52, 88 is nominally about 3000 Å; the thickness of the storage poly 42, 142, 84 and the cell poly 52, 88 is nominally about 1000 Å for each; the thickness of the cell dielectric 50, 87 is nominally about 80 Å; the depth of the etch of the BPSG oxide 32, 132 below the top of the vertical walls of the storage poly 42, 142 which is the same as the height that the cell poly 52, 88 extends upward along the periphery 48 of the storage container 47 walls above the level of the cell poly 52, 88 in the bit line contact region, is about 6000 Å; the thickness of the oxide layer 58, 90 above the highest point of the cell poly 52, 88 is nominally about 4000 Å. In the horizontal direction in the figures, the width of the transistor gate members 20C, 120C in the array 11, 111 is about 0.4 $\mu m$, the word line spacers 19, 119 are about 0.2 $\mu m$ wide, and the gap between the word line spacers 19, 119, which is the same as the width of the bit line contact at the active area 29B, 109A is nominally about 0.2 $\mu m$ to 0.4 $\mu m$; the width of the transistor gate members, such as 20A, 120A at the locations of the metal to poly 1 contacts at the periphery of the array are about 1.2 $\mu m$, which is also the nominal width of the word line contact regions 38. The other relevant dimensions all depend on the above dimensions, or are conventional.

A feature of the invention is that the single etch stop layer 30 is used to form bit line contacts that are self aligned to the transistor gate members 22 and at the same time make storage poly contacts that are self aligned to transistor gate members 22. A related feature is that the same etch stop layer 30 assists in making metal to transistor poly contacts and metal to cell poly contacts without any additional steps.

Another feature of the invention is that the invention provides a method of utilizing contact-through-cell poly technology to make the bit line contacts and at the same time making the metal to cell poly contacts with no additional photo-mask or etch steps.

A feature of the invention related to the above features is that the oxide etch after the isolation of the storage nodes 48 is a partial etch, or the etch is eliminated. This partial etch permits the elimination of a mask step would other wise be necessary to protect the cell poly in the region of the cell poly contact regions 40 (FIG. 7) and the transistor conductive layers 24, 26 (poly 1) during the formation of the bit line contact regions 36.

Another feature of the invention related to the above features is that the steps of making the storage poly nodes 46 also eliminates the etch stop layer 30 in the region of the metal to poly 1 contacts, and then the storage poly 42, cell dielectric 50, and cell poly 52 is eliminated in this region during the cell poly definition step. Thus the poly 1 contact is formed as a "by-product" of other steps, which eliminates at least one photo-mask step.

A further feature of the invention is that the storage poly is isolated without any photo steps in addition to the one that defines the storage poly containers 41. One method of doing this, discussed above in connection with FIGS. 4 and 5, utilizes a spun on resist layer 44 which is partially etched; another method, discussed in connection with FIG. 12, utilizes CMP.

Another feature of the invention is that it lends itself to making bit line contact regions 104 in which the spacers 94 don't close off the future bit line contact. The bit line contact region 104 can be etched extra wide because the oxide etch of the upper insulating layer 90 stops on the cell poly 88. The etch stop layer 130 also assists because the final etch is selective to oxide.

Another feature of the invention is that the wide bit line contact regions 36, 104 also interacts with the etch stop layer 30, 130 to allow the bit line contact to be self aligned with the final etch.

A related feature of the invention to the above features is that it provides an overall efficient method of making compact, multi-megabit DRAM with minimal masking steps exploiting significant self alignment and large cell capacitance for a given cell area.

There has been described a novel, simplified integrated circuit fabrication process and structure which can be utilized to build more compact and better performing DRAMS and which has many other advantages. As indicated above, the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to fabricate a broad area, self-aligned capacitor cell, self-aligned bit line contacts, self-aligned cell poly contacts, self-aligned transistor poly contacts, and define the cell poly with just three photo-mask steps, other implementations of such a process design and structure become evident. It is also evident that the steps recited may in some instances be performed in a different order. Or equivalent structures and process may be substituted for the various structures and processes described. Or a variety of different dimensions and materials may be used. Additional structures and process steps may be added. Consequently, the invention is to be construed as embracing each and every novel feature and novel combination of features present in and/or possessed by the integrated circuit structure and fabrication process described.

What is claimed is:

1. A method of fabricating a integrated circuit dynamic random access memory (DRAM), said DRAM comprising a semiconducting wafer having: a semiconducting substrate; a plurality of transistors formed on said substrate, each transistor including a gate conducting layer; a capacitor formed on said substrate and having a capacitor first conducting layer, a capacitor dielectric layer, and a capacitor second conducting layer; an active area on said substrate adjacent one of said transistors; a bit line contact contacting said active area; and a gate contact contacting said gate conducting layer; said method comprising the steps of:

employing a first etch stop layer to self align said capacitor first conducting layer contact to said gate conducting layer;

employing said first etch stop layer to self align said bit line contact to said gate conducting layer; and utilizing a single photo-mask and etch process to define said bit line contact and etch to said active area and to define said gate contact and etch to said gate conducting layer.

2. A method as in claim 1 wherein said step of utilizing further comprises utilizing said single photo-mask and etch process to define a second capacitor conducting layer contact and etch down to said capacitor second conducting layer.

3. A method of fabricating a integrated circuit dynamic random access memory (DRAM), said DRAM comprising a semiconducting wafer having a semiconducting substrate, a plurality of transistors formed on said substrate, each including a gate conducting layer, a capacitor formed on said substrate and having a capacitor first conducting layer, a capacitor dielectric layer, and a capacitor second conducting layer, an upper insulating layer covering said capacitor second conducting layer, an active area on said substrate adjacent one of said transistors, a bit line contact contacting said active area, a gate contact contacting said gate conducting layer, and a capacitor conducting layer contact, said method comprising the step of:

providing a single photo-mask;

creating a resist layer on said wafer and using said single photo-mask to pattern said resist layer to define said bit line contact and said capacitor conducting layer contact; and etching said pattern into said upper insulating layer and through said capacitor second conducting layer to said active area to form a bit line contact region while etching said pattern into said upper insulating layer to said capacitor second conducting layer to form a capacitor conducting layer contact region.

4. A method as in claim 3 wherein said DRAM also includes a lower insulator layer between said active area and said capacitor second conducting layer in said bit line contact region, which lower insulator layer etches similarly to said upper insulating layer, and wherein said step of etching comprises:

etching through said upper insulating layer to said capacitor second conducting layer in said bit line contact region while etching through said upper insulating layer stopping short of said capacitor second conducting layer in said capacitor conducting layer contact region;

etching through said capacitor second conducting layer in said bit line contact region; and etching through said lower insulating layer in said bit line contact region while completing the etch through said upper insulating layer to said capacitor second conducting layer in said capacitor conducting layer contact region.

5. A method for fabricating an integrated circuit comprising the steps of:

a) providing an integrated circuit wafer having: a semiconducting substrate; a plurality of transistor gate members each comprising a gate insulating layer formed on said substrate and a gate conducting layer on said gate insulating layer; and first and second active areas on said semiconducting substrate;

b) forming a first etch stop layer on said wafer, covering said transistor gate members and said active areas;

c) creating a lower insulating layer on said wafer;

d) utilizing a first photo-mask and etch process to define a capacitor container in said lower insulating layer and said first etch stop layer above said first active area and a gate conducting layer contact region in said lower insulating layer and said etch stop layer above a first transistor gate member;

e) forming a capacitor first conducting layer in said capacitor container and in said transistor gate conducting layer contact region, said capacitor first conducting layer in electrical contact with said first active area;

f) forming a capacitor dielectric layer on said capacitor first conducting layer;

g) forming a capacitor second conducting layer on said capacitor dielectric layer;

h) utilizing a second photo-mask and etch process to remove said capacitor second conducting layer, said capacitor dielectric layer, and said capacitor first conducting layer from said gate conducting layer contact region;

i) creating an upper insulating layer on said wafer;

j) utilizing a third photo-mask and etch process to define a bit line contact region above said second active area and to define a gate conducting layer contact region above said first transistor gate member;

k) creating a capacitor insulating spacer between said capacitor second conducting layer and said bit line contact region; and l) creating a bit line contact in electrical contact with said second active area and a gate conducting layer contact in electrical contact with said gate conducting layer of said first transistor gate member.

6. The method of claim 5 wherein:

said step of utilizing a first photo-mask and etch process further comprises utilizing said first photo-mask and etch process to define a capacitor conducting layer contact region in said lower insulating layer and said first etch stop layer;

said step of utilizing a third photo-mask and etch process further comprises utilizing said third photo-mask and etch process to define a capacitor conducting layer contact region in said upper insulating layer; and said method further comprises the step of creating a capacitor conducting layer contact in electrical contact with said capacitor second conducting layer.

7. The method of claim 6 wherein said step of utilizing a third photo-mask and etch process further comprises:
   etching through said upper insulating layer completely to said capacitor second conducting layer above said second active area while stopping the etch short of said capacitor second conducting layer in said capacitor conducting layer contact region;
   etching through said capacitor second conducting layer above said second active area; and
   etching through said lower insulating layer above said second active area while completing the etch through said upper insulating layer to said capacitor second conducting layer in said capacitor conducting layer contact region.

8. The method of claim 5 wherein between said steps e) and f) the following steps are performed:
   creating a layer of resist on said wafer;
   etching said resist to leave the resist partially filling said capacitor container and said gate conducting layer contact region; and
   partially etching said capacitor first conducting layer to isolate the capacitor first conducting layer from other circuit elements of said DRAM; and
   stripping said resist.

9. The method of claim 8 wherein a partial etch of said lower insulating layer is performed between said steps of etching said capacitor first conducting layer to the level of said resist and said step of stripping said resist.

10. The method of claim 5 wherein there are a plurality of said capacitor containers formed on said wafer, and said wafer is planarized to isolate said capacitor first conducting layers in different ones of said capacitor containers from each other between steps e) and f).

11. The method of claim 5 wherein step j) comprises etching through said upper insulating layer, said capacitor second conducting layer, said capacitor dielectric layer, said lower insulating layer, and said first etch stop layer to said second active area; and said step k) comprises: depositing an insulating film on said wafer; and etching said insulating film to expose said second active area while leaving said capacitor insulating spacer covering said capacitor second conducting layer.

12. The method of claim 5 wherein:
   a second etch stop layer is formed on said wafer between steps i) and j);
   step j) comprises etching through said second etch stop layer, said upper insulating layer, and said capacitor second conducting layer; and
   step k) comprises: forming a third insulating layer on said wafer; preferably etching through said third insulating layer and said lower insulating layer to said first etch stop layer in said bit line region while stopping on said second etch stop layer adjacent said bit line contact region and leaving said third insulating layer covering said capacitor second conducting layer along the sides of said bit line contact region; and etching through said first etch stop layer.

13. The method of claim 5 wherein said first etch stop layer is made of aluminum oxide.

14. The method of claim 5 wherein each of said transistor gate members further comprise an insulating layer on said gate conducting layer and said integrated circuit wafer includes a transistor insulating spacer member separating each of said active areas and said transistor members.

15. The method of claim 14 wherein said insulating layer on said gate conducting layer, said transistor insulating spacer member, and said first etch stop layer are made of silicon nitride.

16. The method of claim 5 wherein said integrated circuit wafer includes a protective insulating layer over said gate conducting layer, and said step of utilizing a second photo-mask and etch process further comprises removing said protective insulating layer above the gate conducting layer in said gate conducting layer contact region.

17. A method of fabricating an integrated circuit comprising a capacitor and a transistor, said method comprising:
   providing an integrated circuit wafer with a semiconducting substrate having: a gate conducting layer forming the gate of said transistor, said gate conducting layer made of a material which has selectivity in both a first etch process and a second etch process; an active area, and an insulating spacer isolating said active area from said transistor gate, said insulating spacer made of a material which has selectivity in a said second etch process;
   forming an etch stop layer on said wafer, said etch stop layer made of a material having selectivity in said first etch process and being etchable in said second etch process, said etch stop layer covering said active area;
   forming a lower insulating layer on said wafer, said lower insulating layer made of a material which is etchable in said first etch process;
   using a container photo-mask and first etch process to etch through said lower insulating layer and a second etch process to etch away said etch stop layer to form a capacitor container while removing said lower insulating layer and said etch stop layer from above a least a portion of said gate conducting layer;
   forming a capacitor cell in said capacitor container;
   forming an upper insulating layer on said wafer, said upper insulating layer made out of a material which is etchable in said first etch process;
   using a contact photo-mask and said first etch process etch to etch through said upper and lower insulating layers and stop on said etch stop layer above said active area and on said portion of said gate conducting layer;
   etching away said etch stop layer above said active area using said second etch process; and
   forming a contact contacting said portion of said gate conducting layer and a contact contacting said active area.

18. A method as in claim 17 wherein said etch stop layer comprises either aluminum oxide or silicon nitride.

* * * * *